United States Patent
Zhou et al.

(10) Patent No.: US 11,075,715 B2
(45) Date of Patent: Jul. 27, 2021

(54) ENCODING METHOD AND APPARATUS

(71) Applicant: HUAWEI TECHNOLOGIES CO., LTD., Guangdong (CN)

(72) Inventors: Yue Zhou, Hangzhou (CN); Rong Li, Hangzhou (CN); Yinggang Du, Shenzhen (CN); Huazi Zhang, Hangzhou (CN); Pengcheng Qiu, Shenzhen (CN); Yunfei Qiao, Hangzhou (CN); Jun Wang, Hangzhou (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 110 days.

(21) Appl. No.: 16/672,309

(22) Filed: Nov. 1, 2019

(65) Prior Publication Data
US 2020/0067638 A1   Feb. 27, 2020

Related U.S. Application Data

(63) Continuation of application No. PCT/CN2018/085368, filed on May 2, 2018.

(30) Foreign Application Priority Data

May 2, 2017   (CN) ......................... 201710301564.2

(51) Int. Cl.
*H04L 1/00* (2006.01)

(52) U.S. Cl.
CPC .......... *H04L 1/0057* (2013.01); *H04L 1/0067* (2013.01); *H04L 1/0076* (2013.01)

(58) Field of Classification Search
None
See application file for complete search history.

(56) References Cited

U.S. PATENT DOCUMENTS

| 8,381,083 B2 | 2/2013 | Wezelenburg et al. |
| 2002/0078418 A1* | 6/2002 | Kikuchi ................ H04L 1/0068 714/789 |

(Continued)

FOREIGN PATENT DOCUMENTS

| CA | 2984374 A1 | 11/2016 |
| CN | 102122966 A | 7/2011 |

(Continued)

OTHER PUBLICATIONS

Huawei Hisilicon: "Polar Coding Design for Control Channel" .3GPP Draft; R1-1706193,Apr. 9, 2017 (Apr. 9, 2017), XP051252505,total 21 pages.

(Continued)

*Primary Examiner* — Kodzovi Acolatse
*Assistant Examiner* — The Hy Nguyen
(74) *Attorney, Agent, or Firm* — Womble Bond Dickinson (US) LLP

(57) ABSTRACT

Embodiments of the present disclosure disclose an encoding method. The method includes: obtaining a corresponding index value from an index module based on values in Z to-be-encoded bits that are obtained and a state space value in a state space module, performing an operation based on the index value and the state space value to obtain a new state space value, encoding the Z to-be-encoded bits that are obtained, and obtaining a value from the new state space value and assigning the value to an auxiliary bit.

16 Claims, 13 Drawing Sheets

(56) References Cited

U.S. PATENT DOCUMENTS

2015/0222295 A1* 8/2015 Li .................... H03M 13/3738
　　　　　　　　　　　　　　　　　　714/755
2016/0013887 A1 1/2016 Shen et al.

FOREIGN PATENT DOCUMENTS

| CN | 103873197 A | 6/2014 |
| CN | 104079370 A | 10/2014 |
| CN | 105811998 A | 7/2016 |
| WO | 2016119105 A1 | 8/2016 |

OTHER PUBLICATIONS

Huawei et al: "Summary of polar code design for control channels",3GPP Draft; R1-1700088,Jan. 16, 2017 (Jan. 16, 2017), XP051207630,total 10 pages.

* cited by examiner

ENCODING METHOD AND APPARATUS

CROSS-REFERENCE TO RELATED APPLICATIONS

This application is a continuation of International Application No. PCT/CN2018/085368, filed on May 2, 2018, which claims priority to Chinese Patent Application No. 201710301564.2, filed on May 2, 2017. The disclosures of the aforementioned patent applications are hereby incorporated by reference in their entireties.

TECHNICAL FIELD

The present disclosure relates to the field of communications technologies, and in particular, to an encoding method and an apparatus.

BACKGROUND

Polar coding (Polar Codes) is a novel channel coding scheme proposed in 2008. Polar coding is designed based on channel polarization (Channel Polarization). As proved theoretically, polar coding is a first code construction scheme that can achieve a Shannon capacity. A polar code is a linear block code.

However, with respect to which coding scheme is to be used to provide assistance for decoding in a process in which a decoder decodes a sequence of encoded bits, there is no solution in the prior art.

SUMMARY

Embodiments of the present disclosure provide an encoding method and an apparatus to resolve a problem about how to perform encoding to provide assistance for decoding in a process in which a decoder decodes a sequence of encoded bits.

According one embodiment of the present disclosure provides an encoding method. The method includes:

S101. receiving a sequence of to-be-encoded bits;

S102. initializing a state space value in a state space module, and obtaining, from the sequence of to-be-encoded bits, a group of Z to-be-encoded bits including Z information bits;

S104. obtaining a corresponding index value from an index module based on values in the Z to-be-encoded bits that are obtained in block S102 and the state space value in the state space module, performing an operation based on the index value and the state space value to obtain a new state space value, and updating the state space value in the state space module to the new state space value;

S105. encoding the Z to-be-encoded bits that are obtained in block S102, and if an auxiliary bit is located between information bits of the Z information bits in the sequence of to-be-encoded bits and an auxiliary bit is located between the Z information bits and a next information bit in the sequence of to-be-encoded bits, obtaining a value from the new state space value and assigning the value to the auxiliary bit, and then performing block S106; and S106. obtaining, from the sequence of to-be-encoded bits, a next group of Z to-be-encoded bits including Z information bits that follow the group of Z to-be-encoded bits, where the next group of Z to-be-encoded bits is adjacent to the group of Z to-be-encoded bits, using the next group of Z to-be-encoded bits as an input for block S104, performing block S104 and block S105, and repeating the cycle until the next group of Z to-be-encoded bits is a last to-be-encoded bit in the sequence of to-be-encoded bits.

In one embodiment, because an encoder encodes an auxiliary bit, a decoder can use the auxiliary bit to perform an assistance operation for decoding such as error correction, error detection, or early stopping on a sequence of encoded bits. In addition, because Z to-be-encoded bits are encoded every time, encoding the auxiliary bit in this block processing manner facilitates hardware implementation, and can effectively improve encoding efficiency and increase a throughput.

In one embodiment, the auxiliary bit is a bit that is generated dynamically on the encoder and used to provide assistance for decoding on the decoder, and the assistance for decoding is error correction, error detection, or helping determine whether to stop decoding in advance, or the like.

With reference to one embodiment, in block S102, positions of the Z information bits in the Z to-be-encoded bits that are obtained are consistent with positions of the Z information bits in the sequence of to-be-encoded bits.

With reference to one embodiment, the obtaining a value from the new state space value and assigning the value to the auxiliary bit if an auxiliary bit is located between information bits of the Z information bits in the sequence of to-be-encoded bits and an auxiliary bit is located between the Z information bits and a next information bit in the sequence of to-be-encoded bits includes: obtaining a value from the new state space value and assigning the value to the auxiliary bit between the information bits of the Z information bits and the auxiliary bit between the Z information bits and the next information bit separately. The value assigned to the auxiliary bit between the information bits of the Z information bits and the value assigned to the auxiliary bit between the Z information bits and the next information bit may be obtained from a same position in the new state space value or obtained from different positions in the new state space value.

With reference to one embodiment, that the next group of Z to-be-encoded bits is a last to-be-encoded bit in the sequence of to-be-encoded bits in block S106 is: a quantity of finally remaining information bits in the sequence of to-be-encoded bits is less than or equal to Z; and if the quantity of finally remaining information bits in the sequence of to-be-encoded bits is less than Z, an insufficient part is filled in with a fixed value 0 or 1.

With reference to one embodiment, before block S104, the method further includes:

precoding $2^z$ permutations and combinations of the Z to-be-encoded bits in the sequence of to-be-encoded bits, and storing a precoding result as an index value in the index module. A coding scheme used in the precoding is consistent with a coding scheme used in the encoding in block S105, and the precoding is preprocessing of the encoding in block S105.

With reference to one embodiment, in block S105, in the block of encoding the Z to-be-encoded bits that are obtained in block S102, the encoding is encoding in a check coding scheme or encoding in an information digest coding scheme or encoding in a linear operation.

With reference to one embodiment, the obtaining a corresponding index value from an index module based on values in the Z to-be-encoded bits that are obtained in block S102 and the state space value in the state space module in block S104 includes:

performing an operation between Z least significant bits of the state space value and the values in the Z to-be-encoded bits that are obtained in block S102 to obtain an index ID, and obtaining, by using the index ID, the index value stored in the index module.

With reference to one embodiment,
the performing an operation based on the index value and the state space value in block S104 includes:
performing a bitwise logical operation between the index value and the state space value.

With reference to one embodiment, the performing a bitwise logical operation between the index value and the state space value may specifically include: performing a bitwise logical operation between the index value and the Z least significant bits of the state space value.

With reference to one embodiment, the obtaining a corresponding index value from an index module based on values in the Z to-be-encoded bits that are obtained in block S102 and the state space value in the state space module in block S104 includes:

S1041. cyclically shifting the state space value in a fixed direction (for example, left or right) by Z bits, then performing an operation between Z least significant bits of the state space value and the values in the Z to-be-encoded bits that are obtained in block S102 to obtain an index ID, and obtaining, by using the index ID, the index value stored in the index module; and correspondingly, the performing an operation based on the index value and the state space value in block S104 includes:

S1042. performing a bitwise logical operation between the index value and the state space value, for example, cyclically left-shifting the state space value by Z bits, and then performing a bitwise logical operation between the index value and the Z least significant bits of the state space value.

With reference to one embodiment, the state space module may be specifically a cyclic redundancy check (CRC) register group. In block S104, the obtaining a corresponding index value from an index module based on values in the Z to-be-encoded bits that are obtained in block S102 and the state space value in the state space module may further include:

S1043. performing an XOR operation between Z most significant bits in the CRC register group and the values in the Z to-be-encoded bits that are obtained in block S102 to obtain an index ID, and obtaining the corresponding index value in the index module by using the index ID; and correspondingly, the performing an operation based on the index value and the state space value in block S104 includes:

S1044. cyclically shifting all bits in the CRC register group in a fixed direction (for example, left or right) by Z bits, and then performing an XOR operation between the index value and Z least significant bits in the CRC register group to obtain a new state space value.

Correspondingly, in the process of obtaining a value from the new state space value and assigning the value to the auxiliary bit in block S105, the auxiliary bit is a PC check bit.

With reference to one embodiment, Z is an even number greater than 0.

With reference to one embodiment, the state space module may be specifically in a form of a register.

With reference to one embodiment, in the block of initializing a state space value in a state space module, the initialized value in the state space module is a value agreed upon between an encoder side (or encoder) and a decoder side (or decoder).

With reference to one embodiment, the state space module is implemented by a register group; and when a state of the register group is initialized to all 1s, in the operation of obtaining a value from the new state space value and assigning the value to the auxiliary bit in block S105, the new state space value 'should be negated, and then a value of at least one position in the new state space value is assigned to the auxiliary bit.

With reference to one embodiment, the obtaining a value from the new state space value and assigning the value to the auxiliary bit in block S105 may include: assigning a value of at least one position in the new state space value to the auxiliary bit.

With reference to one embodiment, in a process of performing block S105 for different Z to-be-encoded bits for a plurality of times, the block of obtaining a value from the new state space value and assigning the value to the auxiliary bit for a plurality of times may include: obtaining a value from a fixed position in the state space module each time and assigning the value to the auxiliary bit; or in a cyclic shift manner, starting from a position in a fixed direction, selecting a value from a position that is replaced successively in the state space module and assigning the value to the auxiliary bit; or in a pseudo random manner, selecting a value from the state space module and assigning the value to the auxiliary bit; or selecting a value from a position in the state space module and assigning the value to the auxiliary bit, where the position is calculated by using a function (for example, a relationship function between a storage space size of the state space module and a sequence number of the auxiliary bit).

With reference to one embodiment, after block S106, the method further includes:

S3060. using the last to-be-encoded bit in the sequence of to-be-encoded bits as an input for block S104, and after performing block S104 and block S105, using an obtained state space value in the state space module as a CRC check bit, and performing CRC coding, where in the process of obtaining a value from the new state space value and assigning the value to the auxiliary bit in block S105, the auxiliary bit may be a PC check bit. Therefore, with reference to block S3060, in the foregoing embodiment of this application, different types of auxiliary bits in a system can be encoded simultaneously, hardware overheads are reduced, and encoding efficiency is improved.

With reference to one embodiment, after block S106, the method further includes:

S307. performing polar coding and rate matching on the sequence of encoded bits to obtain a rate-matched sequence for transmission; and S308. transmitting the rate-matched sequence.

With reference to one embodiment, block S307 and block S308 may be performed after block S3060 is performed.

According to one embodiment, the present disclosure further provides an encoding method. The method includes:

S201. receiving a sequence of to-be-encoded bits;

S202. initializing a state space value in a state space module, and obtaining, from the sequence of to-be-encoded bits, a group of Z to-be-encoded bits including information bits and auxiliary bits, and then performing block S203;

S203. setting a position of an auxiliary bit in the Z to-be-encoded bits to a fixed value, and then performing block S204;

S204. obtaining a corresponding index value from an index module based on values in the Z to-be-encoded bits that are output in block S203 and the state space value in the state space module, performing an operation based on the index value and the state space value to obtain a new state space value, and updating the state space value in the state space module to the new state space value;

S205. encoding the Z to-be-encoded bits that are output in block S203, obtaining a value from the new state space value and assigning the value to the auxiliary bit in the Z to-be-encoded bits, and then performing block S206; and S206. obtaining, from the sequence of to-be-encoded bits, a next group of Z to-be-encoded bits including information bits and auxiliary bits that follow the group of Z to-be-encoded bits, where the next group of Z to-be-encoded bits is adjacent to the group of Z to-be-encoded bits, using the next group of Z to-be-encoded bits as an input for block S203, performing block S203, block S204, and block S205, and repeating the cycle until the next group of Z to-be-encoded bits is a last to-be-encoded bit in the sequence of to-be-encoded bits.

In one embodiment, because an encoder encodes an auxiliary bit, a decoder can use the auxiliary bit to perform an assistance operation for decoding such as error correction, error detection, or early stopping on a sequence of encoded bits. In addition, because Z to-be-encoded bits are encoded every time, encoding the auxiliary bit in this block processing manner facilitates hardware implementation, and can effectively improve encoding efficiency and increase a throughput.

In one embodiment, the auxiliary bit is a bit that is generated dynamically on the encoder and used to provide assistance for decoding on the decoder, and the assistance for decoding is error correction, error detection, or helping determine whether to stop decoding in advance, or the like.

With reference to one embodiment, in block S202, a sequence of the information bits and the auxiliary bits in the Z to-be-encoded bits that are obtained is consistent with a sequence of the information bits and the auxiliary bits in the sequence of to-be-encoded bits.

With reference to one embodiment, that the next group of Z to-be-encoded bits is a last to-be-encoded bit in the sequence of to-be-encoded bits in block S206 is:

a total quantity of finally remaining information bits and auxiliary bits in the sequence of to-be-encoded bits is less than or equal to Z; and if the total quantity of information bits and auxiliary bits in the finally remaining bits in the sequence of to-be-encoded bits is less than Z, an insufficient part is filled in with a fixed value 0 or 1.

With reference to one embodiment, before block S204, the method further includes:

precoding $2^z$ permutations and combinations of the Z to-be-encoded bits in the sequence of to-be-encoded bits, and storing a precoding result as an index value in the index module. A coding scheme used in the precoding is consistent with a coding scheme used in the encoding in block S205, and the precoding is preprocessing of the encoding in block S205.

With reference to one embodiment, in block S205, in the block of encoding the Z to-be-encoded bits that are output in block S203, the encoding is encoding in a check coding scheme or encoding in an information digest coding scheme or encoding in a linear operation.

With reference to one embodiment, the obtaining a corresponding index value from an index module based on values in the Z to-be-encoded bits that are output in block S203 and the state space value in the state space module in block S204 includes:

performing an operation between Z least significant bits of the state space value and the values in the Z to-be-encoded bits that are output in block S203 to obtain an index ID, and obtaining, by using the index ID, the index value stored in the index module.

With reference to one embodiment, the performing an operation based on the index value and the state space value in block S204 includes:

performing a bitwise logical operation between the index value and the state space value.

With reference to one embodiment, the performing a bitwise logical operation between the index value and the state space value may be specifically: performing a bitwise logical operation between the index value and the Z least significant bits of the state space value.

With reference to one embodiment, the obtaining a corresponding index value from an index module based on values in the Z to-be-encoded bits that are output in block S203 and the state space value in the state space module in block S204 includes:

S2041. cyclically shifting the state space value in a fixed direction (for example, left or right) by Z bits, then performing an operation between Z least significant bits of the state space value and the values in the Z to-be-encoded bits that are output in block S203 to obtain an index ID, and obtaining, by using the index ID, the index value stored in the index module; and correspondingly, the performing an operation based on the index value and the state space value in block S204 includes:

S2042. performing a bitwise logical operation between the index value and the state space value, for example, performing a bitwise logical operation between the index value and the Z least significant bits of the state space value.

With reference to one embodiment, the state space module may be specifically a CRC register group. In block S204, the obtaining a corresponding index value from an index module based on values in the Z to-be-encoded bits that are output in block S203 and the state space value in the state space module may further include:

S2043. performing an XOR operation between Z most significant bits in the CRC register group and the values in the Z to-be-encoded bits that are output in block S203 to obtain an index ID, and obtaining the corresponding index value in the index module by using the index ID; and correspondingly, the performing an operation based on the index value and the state space value in block S204 includes:

S2044. cyclically shifting all bits in the CRC register group in a fixed direction (for example, left or right) by Z bits, and then performing an XOR operation between the index value and Z least significant bits in the CRC register group to obtain a new state space value.

Correspondingly, in the process of obtaining a value from the new state space value and assigning the value to the auxiliary bit in block S205, the auxiliary bit is a PC check bit.

With reference to one embodiment, in block S203, the position of the auxiliary bit may be set to a value agreed upon between an encoder side (or encoder) and a decoder side (or decoder), and the value may be 0 or may be 1.

With reference to one embodiment, Z is an even number greater than 0.

With reference to one embodiment, the state space module may be specifically in a form of a register.

With reference to one embodiment, in the block of initializing a state space value in a state space module, the initialized value in the state space module is a value agreed upon between the encoder side (or encoder) and the decoder side (or decoder).

With reference to one embodiment, the state space module may be implemented by a register group; and when a state of the register group is initialized to all 1s, in the operation of obtaining a value from the new state space value and assigning the value to the auxiliary bit in block S205, the new state space value should be negated, and then a value of at least one position in the new state space value is assigned to the auxiliary bit.

With reference to one embodiment, the block of obtaining a value from the new state space value and assigning the value to the auxiliary bit in the process of performing block S205 may include: assigning a value of at least one position in the new state space value to the auxiliary bit.

With reference to one embodiment, in a process of performing block S205 for different Z to-be-encoded bits for a plurality of times, the block of obtaining a value from the new state space value and assigning the value to the auxiliary bit for a plurality of times may include: obtaining a value from a fixed position in the state space module each time and assigning the value to the auxiliary bit; or in a cyclic shift manner, starting from a position in a fixed direction, selecting a value from a position that is replaced successively in the state space module and assigning the value to the auxiliary bit; or in a pseudo random manner, selecting a value from the state space module and assigning the value to the auxiliary bit; or selecting a value from a position in the state space module and assigning the value to the auxiliary bit, where the position is calculated by using a function (for example, a relationship function between a storage space size of the state space module and a sequence number of the auxiliary bit).

With reference to one embodiment, after block S206, the method further includes:

S3060. using the last to-be-encoded bit in the sequence of to-be-encoded bits as an input for block S203, and after performing block S203, block S204, and block S205, using an obtained state space value in the state space module as a CRC check bit, and performing CRC coding, where in the process of obtaining a value from the new state space value and assigning the value to the auxiliary bit in block S205, the auxiliary bit may be a PC check bit. Therefore, with reference to block S3060, in the foregoing embodiment of this application, different types of auxiliary bits in a system can be encoded simultaneously, hardware overheads are reduced, and encoding efficiency is improved.

With reference to one embodiment, after block S206, the method further includes:

S307. performing polar coding and rate matching on the sequence of encoded bits to obtain a rate-matched sequence for transmission; and S308. transmitting the rate-matched sequence.

With reference to one embodiment, block S307 and block S308 may be performed after block S3060 is performed.

According to one embodiment, the present disclosure further provides an encoding method. The method includes:

S301. receiving a sequence of to-be-encoded bits;

S302. initializing a state space value in a state space module, and obtaining, from the sequence of to-be-encoded bits, a group of Z to-be-encoded bits that are adjacent, and then performing block S303;

S303. if the Z to-be-encoded bits include an auxiliary bit, setting a position of the auxiliary bit to a fixed value, or if the Z to-be-encoded bits include a frozen bit, setting a position of the frozen bit to a fixed value, and then performing block S304, where the Z to-be-encoded bits include at least one of an information bit, the frozen bit, and the auxiliary bit;

S304. obtaining a corresponding index value from an index module based on values in the Z to-be-encoded bits that are output in block S303 and the state space value in the state space module, performing an operation based on the index value and the state space value to obtain a new state space value, and updating the state space value in the state space module to the new state space value;

S305. encoding the Z to-be-encoded bits that are output in block S303, and if the Z to-be-encoded bits include the auxiliary bit, obtaining a value from the new state space value and assigning the value to the auxiliary bit, and then performing block S306; and S306. obtaining, from the sequence of to-be-encoded bits, a next group of Z to-be-encoded bits that are adjacent and follow the group of Z to-be-encoded bits, where the next group of Z to-be-encoded bits is adjacent to the group of Z to-be-encoded bits, using the next group of Z to-be-encoded bits as an input for block S303, performing block S303, block S304, and block S305, and repeating the cycle until the next group of Z to-be-encoded bits is a last to-be-encoded bit in the sequence of to-be-encoded bits.

In one embodiment, because an encoder encodes an auxiliary bit, a decoder can use the auxiliary bit to perform an assistance operation for decoding such as error correction, error detection, or early stopping on a sequence of encoded bits. In addition, because Z to-be-encoded bits are encoded every time, encoding the auxiliary bit in this block processing manner facilitates hardware implementation, and can effectively improve encoding efficiency and increase a throughput.

In one embodiment, the auxiliary bit is a bit that is generated dynamically on the encoder and used to provide assistance for decoding on the decoder, and the assistance for decoding is error correction, error detection, or helping determine whether to stop decoding in advance, or the like.

With reference to one embodiment, in block S302, a sequence of information bits, auxiliary bits, and frozen bits in the Z to-be-encoded bits that are obtained is consistent with a sequence of the information bits, the auxiliary bits, and the frozen bits in the sequence of to-be-encoded bits.

With reference to one embodiment, that the next group of Z to-be-encoded bits being adjacent is a last to-be-encoded bit in the sequence of to-be-encoded bits in block S306 is:

a quantity of finally remaining to-be-encoded bits in the sequence of to-be-encoded bits is less than or equal to Z; and if the quantity of finally remaining to-be-encoded bits in the sequence of to-be-encoded bits is less than Z, an insufficient part is filled in with a fixed value 0 or 1.

With reference to one embodiment, in block S303, the position of the frozen bit is set to the fixed value, and the fixed value is a fixed value agreed upon between an encoder side (or encoder) and a decoder side (or decoder).

With reference to one embodiment, in block S303, the position of the auxiliary bit may be set to a value agreed upon between the encoder side (or encoder) and the decoder side (or decoder), and the value may be 0 or may be 1.

With reference to one embodiment, Z is an even number greater than 0.

With reference to one embodiment, the state space module may be specifically in a form of a register.

With reference to one embodiment, in the block of initializing a state space value in a state space module, the initialized value in the state space module is a value agreed upon between the encoder side (or encoder) and the decoder side (or decoder).

With reference to one embodiment, the state space module may be implemented by a register group; and when a state of the register group is initialized to all 1s, in the operation of obtaining a value from the new state space value and assigning the value to the auxiliary bit in block S305, the new state space value should be negated, and then a value of at least one position in the new state space value is assigned to the auxiliary bit.

With reference to one embodiment, the block of obtaining a value from the new state space value and assigning the value to the auxiliary bit in the process of performing block S305 may include: assigning a value of at least one position in the new state space value to the auxiliary bit.

With reference to one embodiment, in a process of performing block S305 for different Z to-be-encoded bits for a plurality of times, the block of obtaining a value from the new state space value and assigning the value to the auxiliary bit for a plurality of times may include: obtaining a value from a fixed position in the state space module each time and assigning the value to the auxiliary bit; or in a cyclic shift manner, starting from a position in a fixed direction, selecting a value from a position that is replaced successively in the state space module and assigning the value to the auxiliary bit; or in a pseudo random manner, selecting a value from the state space module and assigning the value to the auxiliary bit; or selecting a value from a position in the state space module and assigning the value to the auxiliary bit, where the position is calculated by using a function (for example, a relationship function between a storage space size of the state space module and a sequence number of the auxiliary bit).

With reference to one embodiment, before block S304, the method further includes:

precoding $2^Z$ permutations and combinations of the Z to-be-encoded bits in the sequence of to-be-encoded bits, and storing a precoding result as an index value in the index module. A coding scheme used in the precoding is consistent with a coding scheme used in the encoding in block S305, and the precoding is preprocessing of the encoding in block S305.

With reference to one embodiment, in block S305, in the block of encoding the Z to-be-encoded bits that are output in block S303, the encoding is encoding in a check coding scheme or encoding in an information digest coding scheme or encoding in a linear operation.

With reference to one embodiment, the obtaining a corresponding index value from an index module based on values in the Z to-be-encoded bits that are output in block S303 and the state space value in the state space module in block S304 includes:

performing an operation between Z least significant bits of the state space value and the values in the Z to-be-encoded bits that are output in block S303 to obtain an index ID, and obtaining, by using the index ID, the index value stored in the index module.

With reference to one embodiment, the performing an operation based on the index value and the state space value in block S304 includes:

performing a bitwise logical operation between the index value and the state space value.

With reference to one embodiment, the performing a bitwise logical operation between the index value and the state space value may be specifically: performing a bitwise logical operation between the index value and the Z least significant bits of the state space value.

With reference to one embodiment, the obtaining a corresponding index value from an index module based on values in the Z to-be-encoded bits that are output in block S303 and the state space value in the state space module in block S304 includes:

S3041. cyclically shifting the state space value in a fixed direction (for example, left or right) by Z bits, then performing an operation between Z least significant bits of the state space value and the values in the Z to-be-encoded bits that are output in block S303 to obtain an index ID, and obtaining, by using the index ID, the index value stored in the index module; and correspondingly, the performing an operation based on the index value and the state space value in block S304 includes:

S3042. performing a bitwise logical operation between the index value and the state space value, for example, performing a bitwise logical operation between the index value and the Z least significant bits of the state space value.

With reference to one embodiment, the state space module may be specifically a CRC register group. In block S304, the obtaining a corresponding index value from an index module based on values in the Z to-be-encoded bits that are output in block S303 and the state space value in the state space module may further include:

S3043. performing an XOR operation between Z most significant bits in the CRC register group and the values in the Z to-be-encoded bits that are output in block S303 to obtain an index ID, and obtaining the corresponding index value in the index module by using the index ID; and correspondingly, the performing an operation based on the index value and the state space value in block S304 includes:

S3044. cyclically shifting all bits in the CRC register group in a fixed direction (for example, left or right) by Z bits, and then performing an XOR operation between the index value and Z least significant bits in the CRC register group to obtain a new state space value.

Correspondingly, in the process of obtaining a value from the new state space value and assigning the value to the auxiliary bit in block S305, the auxiliary bit is a PC check bit.

With reference to one embodiment, after block S306, the method further includes:

S3060. using the last to-be-encoded bit in the sequence of to-be-encoded bits as an input for block S303, and after performing block S303, block S304, and block S305, using an obtained state space value in the state space module as a CRC check bit, and performing CRC coding, where in the process of obtaining a value from the new state space value and assigning the value to the auxiliary bit in block S305, the auxiliary bit may be a PC check bit. Therefore, with reference to block S3060, in the foregoing embodiment of this application, different types of auxiliary bits in a system can be encoded simultaneously, hardware overheads are reduced, and encoding efficiency is improved.

With reference to one embodiment, after block S306, the method further includes:

S307. performing polar coding and rate matching on the sequence of encoded bits to obtain a rate-matched sequence for transmission; and S308. transmitting the rate-matched sequence.

With reference to one embodiment, block S307 and block S308 may be performed after block S3060 is performed.

According one embodiment of the present disclosure further provides an encoding processing apparatus. The processing apparatus may be implemented by hardware or may be implemented by software. When the processing apparatus is implemented by hardware, the processing apparatus includes:

an input interface circuit, configured to receive a sequence of to-be-encoded bits; and a logic circuit, configured to: initialize a state space value in a state space module, and obtain, from the sequence of to-be-encoded bits, a group of Z to-be-encoded bits including Z information bits; and obtain a new state space value based on the Z to-be-encoded bits that are obtained, and assign a value to an auxiliary bit, where the obtaining anew state space value based on the Z to-be-encoded bits that are obtained, and assigning a value to an auxiliary bit includes: obtaining a corresponding index value from an index module based on values in the Z to-be-encoded bits that are obtained and the state space value in the state space module, performing an operation based on the index value and the state space value to obtain a new state space value, and updating the state space value in the state space module to the new state space value; encoding the Z to-be-encoded bits that are obtained, and if an auxiliary bit is located between information bits of the Z information bits in the sequence of to-be-encoded bits and an auxiliary bit is located between the Z information bits and a next information bit in the sequence of to-be-encoded bits, obtaining a value from the new state space value and assigning the value to the auxiliary bit; and obtaining, from the sequence of to-be-encoded bits, a next group of Z to-be-encoded bits including Z information bits that follow the group of Z to-be-encoded bits, where the next group of Z to-be-encoded bits is adjacent to the group of Z to-be-encoded bits, obtaining a new state space value based on the next group of Z to-be-encoded bits, assigning a value to an auxiliary bit, and repeating the cycle until the next group of Z to-be-encoded bits is a last to-be-encoded bit in the sequence of to-be-encoded bits.

In one embodiment, because an encoder encodes an auxiliary bit, a decoder can use the auxiliary bit to perform an assistance operation for decoding such as error correction, error detection, or early stopping on a sequence of encoded bits. In addition, because Z to-be-encoded bits are encoded every time, encoding the auxiliary bit in this block processing manner facilitates hardware implementation, and can effectively improve encoding efficiency and increase a throughput.

In one embodiment, the auxiliary bit is a bit that is generated dynamically on the encoder and used to provide assistance for decoding on the decoder, and the assistance for decoding is error correction, error detection, or helping determine whether to stop decoding in advance, or the like.

With reference to one embodiment, a sequence of the Z information bits in the Z to-be-encoded bits that are obtained is consistent with a sequence of the Z information bits in the sequence of to-be-encoded bits.

With reference to one embodiment, the obtaining a value from the new state space value and assigning the value to the auxiliary bit if an auxiliary bit is located between information bits of the Z information bits in the sequence of to-be-encoded bits and an auxiliary bit is located between the Z information bits and a next information bit in the sequence of to-be-encoded bits includes: obtaining a value from the new state space value and assigning the value to the auxiliary bit between the information bits of the Z information bits and the auxiliary bit between the Z information bits and the next information bit separately. The value assigned to the auxiliary bit between the information bits of the Z information bits and the value assigned to the auxiliary bit between the Z information bits and the next information bit may be obtained from a same position in the new state space value or obtained from different positions in the new state space value.

With reference to one embodiment, that the next group of Z to-be-encoded bits is a last to-be-encoded bit in the sequence of to-be-encoded bits is: a quantity of finally remaining information bits in the sequence of to-be-encoded bits is less than or equal to Z; and if the quantity of finally remaining information bits in the sequence of to-be-encoded bits is less than Z, an insufficient part is filled in with a fixed value 0 or 1.

With reference to one embodiment, the logic circuit is further configured to:

precode $2^Z$ permutations and combinations of the Z to-be-encoded bits in the sequence of to-be-encoded bits, and store a precoding result as an index value in the index module.

With reference to one embodiment, when the Z to-be-encoded bits that are obtained are encoded, the encoding is encoding in a check coding scheme or encoding in an information digest coding scheme or encoding in a linear operation.

With reference to one embodiment, the obtaining a corresponding index value from an index module based on values in the Z to-be-encoded bits that are obtained and the state space value in the state space module includes:

performing an operation between Z least significant bits of the state space value and the values in the Z to-be-encoded bits that are obtained to obtain an index ID, and obtaining, by using the index ID, the index value stored in the index module.

With reference to one embodiment, the performing an operation based on the index value and the state space value includes:

performing a bitwise logical operation between the index value and the state space value.

With reference to one embodiment, the performing a bitwise logical operation between the index value and the state space value may specifically include: performing a bitwise logical operation between the index value and the Z least significant bits of the state space value.

With reference to one embodiment, the obtaining a corresponding index value from an index module based on values in the Z to-be-encoded bits that are obtained and the state space value in the state space module includes:

cyclically shifting the state space value in a fixed direction (for example, left or right) by Z bits, then performing an operation between Z least significant bits of the state space value and the values in the Z to-be-encoded bits to obtain an index ID, and obtaining, by using the index ID, the index value stored in the index module; and correspondingly, the performing an operation based on the index value and the state space value includes:

performing a bitwise logical operation between the index value and the state space value, for example, cyclically left-shifting the state space value by Z bits, and then performing a bitwise logical operation between the index value and the Z least significant bits of the state space value.

With reference to one embodiment, the state space module may be specifically a CRC register group. The obtaining a corresponding index value from an index module based on values in the Z to-be-encoded bits that are obtained in block S102 and the state space value in the state space module may further include:

performing an XOR operation between Z most significant bits in the CRC register group and the values in the Z to-be-encoded bits that are obtained in block S102 to obtain an index ID, and obtaining the corresponding index value in the index module by using the index ID; and correspondingly, the performing an operation based on the index value and the state space value includes:

cyclically shifting all bits in the CRC register group in a fixed direction (for example, left or right) by Z bits, and then performing an XOR operation between the index value and Z least significant bits in the CRC register group to obtain a new state space value.

Correspondingly, when the value is obtained from the new state space value and assigned to the auxiliary bit, the auxiliary bit is a PC check bit.

With reference to the one embodiment, Z is an even number greater than 0.

With reference to one embodiment, the state space module may be specifically in a form of a register.

With reference to one embodiment, the initialized value in the state space module is a value agreed upon between an encoder side (or encoder) and a decoder side (or decoder).

With reference to one embodiment, the state space module is implemented by a register group; and when a state of the register group is initialized to all 1s, when the value is obtained from the new state space value and assigned to the auxiliary bit, the new state space value should be negated, and then a value of at least one position in the new state space value is assigned to the auxiliary bit.

With reference to one embodiment, the obtaining a value from the new state space value and assigning the value to the auxiliary bit may include: assigning a value of at least one position in the new state space value to the auxiliary bit.

With reference to one embodiment, for different Z to-be-encoded bits for a plurality of times, the obtaining a value from the new state space value and assigning the value to the auxiliary bit for a plurality of times may include: obtaining a value from a fixed position in the state space module each time and assigning the value to the auxiliary bit; or in a cyclic shift manner, starting from a position in a fixed direction, selecting a value from a position that is replaced successively in the state space module and assigning the value to the auxiliary bit; or in a pseudo random manner, selecting a value from the state space module and assigning the value to the auxiliary bit; or selecting a value from a position in the state space module and assigning the value to the auxiliary bit, where the position is calculated by using a function (for example, a relationship function between a storage space size of the state space module and a sequence number of the auxiliary bit).

With reference to one embodiment, the logic circuit is further configured to:

obtain a new state space value based on the last to-be-encoded bit in the sequence of to-be-encoded bits, and after assigning a value to an auxiliary bit, use the obtained state space value in the state space module as a CRC check bit, and perform CRC coding, where when the value is obtained from the new state space value and assigned to the auxiliary bit, the auxiliary bit may be a PC check bit. Therefore, in the foregoing embodiment of this application, different types of auxiliary bits in a system can be encoded simultaneously, hardware overheads are reduced, and encoding efficiency is improved.

With reference to one embodiment, the processing apparatus may be a chip or an integrated circuit.

According one embodiment the present disclosure further provides an encoding processing apparatus. The processing apparatus may be implemented by hardware or may be implemented by software. When the processing apparatus is implemented by hardware, the processing apparatus includes:

the input interface circuit, configured to receive a sequence of to-be-encoded bits; and the logic circuit, configured to: initialize a state space value in a state space module, and obtain, from the sequence of to-be-encoded bits, a group of Z to-be-encoded bits including information bits and auxiliary bits; and obtain a new state space value based on the Z to-be-encoded bits that are obtained, and assign a value to an auxiliary bit, where the obtaining a new state space value based on the Z to-be-encoded bits that are obtained, and assigning a value to an auxiliary bit includes: setting a position of an auxiliary bit in the Z to-be-encoded bits to a fixed value; then obtaining a corresponding index value from an index module based on values in the Z to-be-encoded bits and the state space value in the state space module, performing an operation based on the index value and the state space value to obtain a new state space value, and updating the state space value in the state space module to the new state space value; encoding the Z to-be-encoded bits after the position of the auxiliary bit in the Z to-be-encoded bits is set to the fixed value, and obtaining a value from the new state space value and assigning the value to the auxiliary bit in the Z to-be-encoded bits; and then obtaining, from the sequence of to-be-encoded bits, a next group of Z to-be-encoded bits including information bits and auxiliary bits that follow the group of Z to-be-encoded bits, where the next group of Z to-be-encoded bits is adjacent to the group of Z to-be-encoded bits, obtaining a new state space value based on the next group of Z to-be-encoded bits, assigning a value to an auxiliary bit, and repeating the cycle until the next group of Z to-be-encoded bits is a last to-be-encoded bit in the sequence of to-be-encoded bits.

In one embodiment, because an encoder encodes an auxiliary bit, a decoder can use the auxiliary bit to perform an assistance operation for decoding such as error correction, error detection, or early stopping on a sequence of encoded bits. In addition, because Z to-be-encoded bits are encoded every time, encoding the auxiliary bit in this block processing manner facilitates hardware implementation, and can effectively improve encoding efficiency and increase a throughput.

In one embodiment, the auxiliary bit is a bit that is generated dynamically on the encoder and used to provide assistance for decoding on the decoder, and the assistance for decoding is error correction, error detection, or helping determine whether to stop decoding in advance, or the like.

With reference to one embodiment, a sequence of the information bits and the auxiliary bits in the Z to-be-encoded bits that are obtained is consistent with a sequence of the information bits and the auxiliary bits in the sequence of to-be-encoded bits.

With reference to one embodiment, that the next group of Z to-be-encoded bits is a last to-be-encoded bit in the sequence of to-be-encoded bits is:

a total quantity of information bits and auxiliary bits in finally remaining bits in the sequence of to-be-encoded bits is less than or equal to Z; and if the total quantity of information bits and auxiliary bits in the finally remaining bits in the sequence of to-be-encoded bits is less than Z, an insufficient part is filled in with a fixed value 0 or 1.

With reference to one embodiment, the logic circuit is further configured to precode $2^Z$ permutations and combinations of the Z to-be-encoded bits in the sequence of to-be-encoded bits, and store a precoding result as an index value in the index module.

With reference to one embodiment, when the Z to-be-encoded bits are encoded, the encoding is encoding in a check coding scheme or encoding in an information digest coding scheme or encoding in a linear operation.

With reference to one embodiment, the obtaining a corresponding index value from an index module based on values in the Z to-be-encoded bits and the state space value in the state space module includes:

performing an operation between Z least significant bits of the state space value and the values in the Z to-be-encoded bits to obtain an index ID, and obtaining, by using the index ID, the index value stored in the index module.

With reference to one embodiment, the performing an operation based on the index value and the state space value includes:

performing a bitwise logical operation between the index value and the state space value.

With reference to one embodiment, the performing a bitwise logical operation between the index value and the state space value may be specifically: performing a bitwise logical operation between the index value and the Z least significant bits of the state space value.

With reference to one embodiment, the obtaining a corresponding index value from an index module based on values in the Z to-be-encoded bits and the state space value in the state space module includes:

cyclically shifting the state space value in a fixed direction (for example, left or right) by Z bits, then performing an operation between Z least significant bits of the state space value and the values in the Z to-be-encoded bits to obtain an index ID, and obtaining, by using the index ID, the index value stored in the index module; and correspondingly, the performing an operation based on the index value and the state space value includes:

performing a bitwise logical operation between the index value and the state space value, for example, performing a bitwise logical operation between the index value and the Z least significant bits of the state space value.

With reference to one embodiment, the state space module may be specifically a CRC register group. The obtaining a corresponding index value from an index module based on values in the Z to-be-encoded bits and the state space value in the state space module may further include:

performing an XOR operation between Z most significant bits in the CRC register group and the values in the Z to-be-encoded bits that are output in block S203 to obtain an index ID, and obtaining the corresponding index value in the index module by using the index ID; and correspondingly, the performing an operation based on the index value and the state space value includes:

cyclically shifting all bits in the CRC register group in a fixed direction (for example, left or right) by Z bits, and then performing an XOR operation between the index value and Z least significant bits in the CRC register group to obtain a new state space value.

Correspondingly, when the value is obtained from the new state space value and assigned to the auxiliary bit, the auxiliary bit is a PC check bit.

With reference to one embodiment, the position of the auxiliary bit may be set to a value agreed upon between an encoder side (or encoder) and a decoder side (or decoder), and the value may be 0 or may be 1.

With reference to one embodiment, Z is an even number greater than 0.

With reference to one embodiment, the state space module may be specifically in a form of a register.

With reference to one embodiment, when the state space value in the state space module is initialized, the initialized value in the state space module is a value agreed upon between the encoder side (or encoder) and the decoder side (or decoder).

With reference to one embodiment, the state space module may be implemented by a register group; and when a state of the register group is initialized to all 1s, when the value is obtained from the new state space value and assigned to the auxiliary bit, the new state space value should be negated, and then a value of at least one position in the new state space value is assigned to the auxiliary bit.

With reference to one embodiment, the obtaining a value from the new state space value and assigning the value to the auxiliary bit may include: assigning a value of at least one position in the new state space value to the auxiliary bit.

With reference to one embodiment, for different Z to-be-encoded bits for a plurality of times, the obtaining a value from the new state space value and assigning the value to the auxiliary bit for a plurality of times may include: obtaining a value from a fixed position in the state space module each time and assigning the value to the auxiliary bit; or in a cyclic shift manner, starting from a position in a fixed direction, selecting a value from a position that is replaced successively in the state space module and assigning the value to the auxiliary bit; or in a pseudo random manner, selecting a value from the state space module and assigning the value to the auxiliary bit; or selecting a value from a position in the state space module and assigning the value to the auxiliary bit, where the position is calculated by using a function (for example, a relationship function between a storage space size of the state space module and a sequence number of the auxiliary bit).

With reference to one embodiment, the logic circuit is further configured to:

obtain a new state space value based on the last to-be-encoded bit in the sequence of to-be-encoded bits, and after assigning a value to an auxiliary bit, use the obtained state space value in the state space module as a CRC check bit, and perform CRC coding, where when the value is obtained from the new state space value and assigned to the auxiliary bit, the auxiliary bit may be a PC check bit. Therefore, in the foregoing embodiment of this application, different types of auxiliary bits in a system can be encoded simultaneously, hardware overheads are reduced, and encoding efficiency is improved.

With reference to one embodiment, the processing apparatus may be a chip or an integrated circuit.

According to one embodiment the present disclosure further provides an encoding processing apparatus. The processing apparatus may be implemented by hardware or may be implemented by software. When the processing apparatus is implemented by hardware, the processing apparatus includes:

the input interface circuit, configured to receive a sequence of to-be-encoded bits; and the logic circuit, configured to: initialize a state space value in a state space module, and obtain, from the sequence of to-be-encoded bits, a group of Z to-be-encoded bits that are adjacent; and obtain a new state space value based on the Z to-be-encoded bits that are obtained, and assign a value to an auxiliary bit, where the obtaining a new state space value based on the Z to-be-encoded bits that are obtained, and assigning a value to an auxiliary bit includes: if the Z to-be-encoded bits include an auxiliary bit, setting a position of the auxiliary bit to a fixed value, or if the Z to-be-encoded bits include a frozen bit, setting a position of the frozen bit to a fixed value, where the Z to-be-encoded bits include at least one of an information bit, the frozen bit, and the auxiliary bit; then obtaining a corresponding index value from an index module based on values in the Z to-be-encoded bits and the state space value in the state space module, performing an operation based on the index value and the state space value to obtain a new state space value, and updating the state space value in the state space module to the new state space value; encoding the Z to-be-encoded bits after the positions of the auxiliary bit and the frozen bit in the Z to-be-encoded bits are set to the fixed values, and if the Z to-be-encoded bits include the auxiliary bit, obtaining a value from the new state space value and assigning the value to the auxiliary bit; and then obtaining, from the sequence of to-be-encoded bits, a next group of Z to-be-encoded bits that are adjacent and follow the group of Z to-be-encoded bits, where the next group of Z to-be-encoded bits is adjacent to the group of Z to-be-encoded bits, obtaining a new state space value based on the next group of Z to-be-encoded bits, assigning a value to an auxiliary bit, and repeating the cycle until the next group of Z to-be-encoded bits is a last to-be-encoded bit in the sequence of to-be-encoded bits.

In one embodiment, because an encoder encodes an auxiliary bit, a decoder can use the auxiliary bit to perform an assistance operation for decoding such as error correction, error detection, or early stopping on a sequence of encoded bits. In addition, because Z to-be-encoded bits are encoded every time, encoding the auxiliary bit in this block processing manner facilitates hardware implementation, and can effectively improve encoding efficiency and increase a throughput.

In one embodiment, the auxiliary bit is a bit that is generated dynamically on the encoder and used to provide assistance for decoding on the decoder, and the assistance for decoding is error correction, error detection, or helping determine whether to stop decoding in advance, or the like.

With reference to one embodiment, a sequence of information bits, auxiliary bits, and frozen bits in the Z to-be-encoded bits that are obtained is consistent with a sequence of the information bits, the auxiliary bits, and the frozen bits in the sequence of to-be-encoded bits.

With reference to one embodiment, that the next group of Z to-be-encoded bits being adjacent is a last to-be-encoded bit in the sequence of to-be-encoded bits is:

a quantity of finally remaining to-be-encoded bits in the sequence of to-be-encoded bits is less than or equal to Z; and if the quantity of finally remaining to-be-encoded bits in the sequence of to-be-encoded bits is less than Z, an insufficient part is filled in with a fixed value 0 or 1.

With reference to one embodiment, the position of the frozen bit is set to the fixed value, and the fixed value is a fixed value agreed upon between an encoder side (or encoder) and a decoder side (or decoder).

With reference to one embodiment, the position of the auxiliary bit may be set to a value agreed upon between the encoder side (or encoder) and the decoder side (or decoder), and the value may be 0 or may be 1.

With reference to one embodiment, Z is an even number greater than 0.

With reference to one embodiment, the state space module may be specifically in a form of a register.

With reference to one embodiment, the initialized value in the state space module is a value agreed upon between the encoder side (or encoder) and the decoder side (or decoder).

With reference to one embodiment, the state space module may be implemented by a register group; and when a state of the register group is initialized to all 1s, when the value is obtained from the new state space value and assigned to the auxiliary bit, the new state space value should be negated, and then a value of at least one position in the new state space value is assigned to the auxiliary bit.

With reference to one embodiment, the obtaining a value from the new state space value and assigning the value to the auxiliary bit may include: assigning a value of at least one position in the new state space value to the auxiliary bit.

With reference to one embodiment, for different Z to-be-encoded bits for a plurality of times, the obtaining a value from the new state space value and assigning the value to the auxiliary bit for a plurality of times may include: obtaining a value from a fixed position in the state space module each time and assigning the value to the auxiliary bit; or in a cyclic shift manner, starting from a position in a fixed direction, selecting a value from a position that is replaced successively in the state space module and assigning the value to the auxiliary bit; or in a pseudo random manner, selecting a value from the state space module and assigning the value to the auxiliary bit; or selecting a value from a position in the state space module and assigning the value to the auxiliary bit, where the position is calculated by using a function (for example, a relationship function between a storage space size of the state space module and a sequence number of the auxiliary bit).

With reference to one embodiment, the logic circuit is further configured to:

precode $2^Z$ permutations and combinations of the Z to-be-encoded bits in the sequence of to-be-encoded bits, and store a precoding result as an index value in the index module.

With reference to one embodiment, when the Z to-be-encoded bits are encoded, the encoding is encoding in a check coding scheme or encoding in an information digest coding scheme or encoding in a linear operation.

With reference to one embodiment, the obtaining a corresponding index value from an index module based on values in the Z to-be-encoded bits and the state space value in the state space module includes:

performing an operation between Z least significant bits of the state space value and the values in the Z to-be-encoded bits to obtain an index ID, and obtaining, by using the index ID, the index value stored in the index module.

With reference to one embodiment, the performing an operation based on the index value and the state space value includes:

performing a bitwise logical operation between the index value and the state space value.

With reference to one embodiment, the performing a bitwise logical operation between the index value and the state space value may be specifically: performing a bitwise logical operation between the index value and the Z least significant bits of the state space value.

With reference to one embodiment, the obtaining a corresponding index value from an index module based on values in the Z to-be-encoded bits and the state space value in the state space module includes:

cyclically shifting the state space value in a fixed direction (for example, left or right) by Z bits, then performing an operation between Z least significant bits of the state space value and the values in the Z to-be-encoded bits to obtain an index ID, and obtaining, by using the index ID, the index value stored in the index module; and correspondingly, the performing an operation based on the index value and the state space value includes:

performing a bitwise logical operation between the index value and the state space value, for example, performing a bitwise logical operation between the index value and the Z least significant bits of the state space value.

With reference to one embodiment, the state space module may be specifically a CRC register group. The obtaining a corresponding index value from an index module based on values in the Z to-be-encoded bits and the state space value in the state space module may further include:

performing an XOR operation between Z most significant bits in the CRC register group and the values in the Z to-be-encoded bits to obtain an index ID, and obtaining the corresponding index value in the index module by using the index ID; and correspondingly, the performing an operation based on the index value and the state space value includes:

cyclically shifting all bits in the CRC register group in a fixed direction (for example, left or right) by Z bits, and then performing an XOR operation between the index value and Z least significant bits in the CRC register group to obtain a new state space value.

Correspondingly, when the value is obtained from the new state space value and assigned to the auxiliary bit, the auxiliary bit is a PC check bit.

With reference to one embodiment, the logic circuit is further configured to:

obtain a new state space value based on the last to-be-encoded bit in the sequence of to-be-encoded bits, and after assigning a value to an auxiliary bit, use the obtained state space value in the state space module as a CRC check bit, and perform CRC coding, where when the value is obtained from the new state space value and assigned to the auxiliary bit, the auxiliary bit may be a PC check bit. Therefore, in the foregoing embodiment of this application, different types of auxiliary bits in a system can be encoded simultaneously, hardware overheads are reduced, and encoding efficiency is improved.

With reference to one embodiment, the processing apparatus may be a chip or an integrated circuit.

When the processing apparatus in the fourth aspect, the fifth aspect, and the sixth aspect is implemented by software, the processing apparatus includes:

a memory, configured to store a program; and a processor, configured to execute the program stored in the memory, where when the program is executed, the processing apparatus is configured to implement each embodiment of the encoding method in the first aspect, or the second aspect, or the third aspect.

The memory may be a physically independent unit, or may be integrated with the processor.

According one embodiment this application further provides a communications device, configured to implement an encoding function. The communications device includes the processing apparatus in each of the foregoing aspects, and a transceiver, where the transceiver is configured to transmit a rate-matched sequence.

According to one embodiment this application further provides a computer-readable storage medium. The computer-readable storage medium stores an instruction, and when the instruction runs on a computer, the computer is enabled to perform the method in each of the foregoing aspects.

According to one embodiment this application further provides a computer program product including an instruction. When the computer program product runs on a computer, the computer is enabled to perform the method in each of the foregoing aspects.

DESCRIPTION OF EMBODIMENTS

The following further describes specific embodiments of the present disclosure in detail with reference to accompanying drawings.

Figure 1:
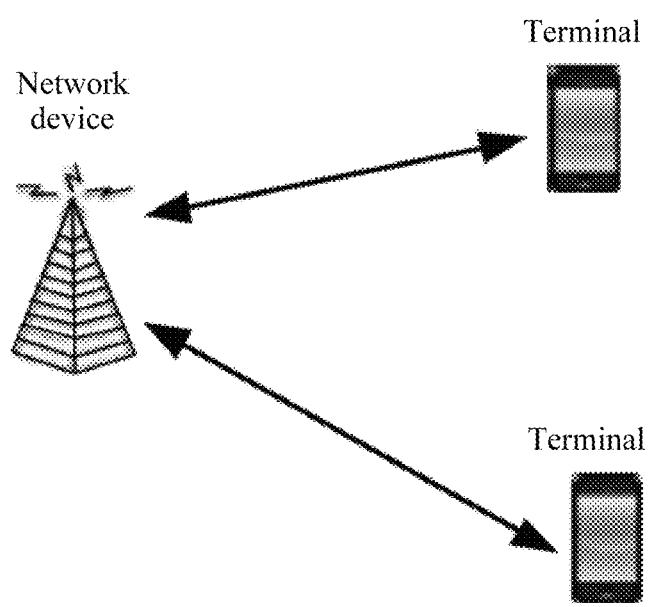
FIG. 1 is a schematic structural diagram of a wireless communications system.

FIG. 1 is a wireless communications system to which the embodiments of this application are applicable. The wireless communications system may include at least one network device, and the network device communicates with one or more terminals. The network device may be a base station, or may be a device integrating a base station and a base station controller, or may be another device having a similar communication function.

It should be noted that, the wireless communications system mentioned in the embodiments of this application includes but is not limited to a Narrowband Internet of Things (English: NarrowBand Internet of Things, NB-IoT for short), a global system for mobile communications (English: Global System for Mobile Communications, GSM for short), an enhanced data rate for GSM evolution (English: Enhanced Data rate for GSM Evolution, EDGE for short) system, a wideband code division multiple access (English: Wideband Code Division Multiple Access, WCDMA for short) system, a code division multiple Access 2000 (English: Code Division Multiple Access, CDMA2000 for short) system, a time division-synchronous code division multiple access (English: Time Division-Synchronous Code Division Multiple Access, TD-SCDMA for short) system, a long term evolution (English: Long Term Evolution, LTE for short) system, three application scenarios of a next-generation 5G mobile communications system, that is, eMBB, URLLC, and eMTC, or a new communications system that may appear in the future.

Terminals included in the embodiments of this application may include various handheld devices, vehicle-mounted devices, wearable devices, or computing devices that have a wireless communication function, or other processing devices connected to a wireless modem. The terminal may be an MS (English: Mobile Station), a subscriber unit (English: subscriber unit), a cellular phone (English: cellular phone), a smartphone (English: smartphone), a wireless data card, a personal digital assistant (English: Personal Digital Assistant, PDA for short) computer, a tablet computer, a wireless modem (modem), a handheld device (English: handset), a laptop computer (English: laptop computer), a machine type communications (English: Machine Type Communications, MTC for short) terminal, or the like.

Figure 2:
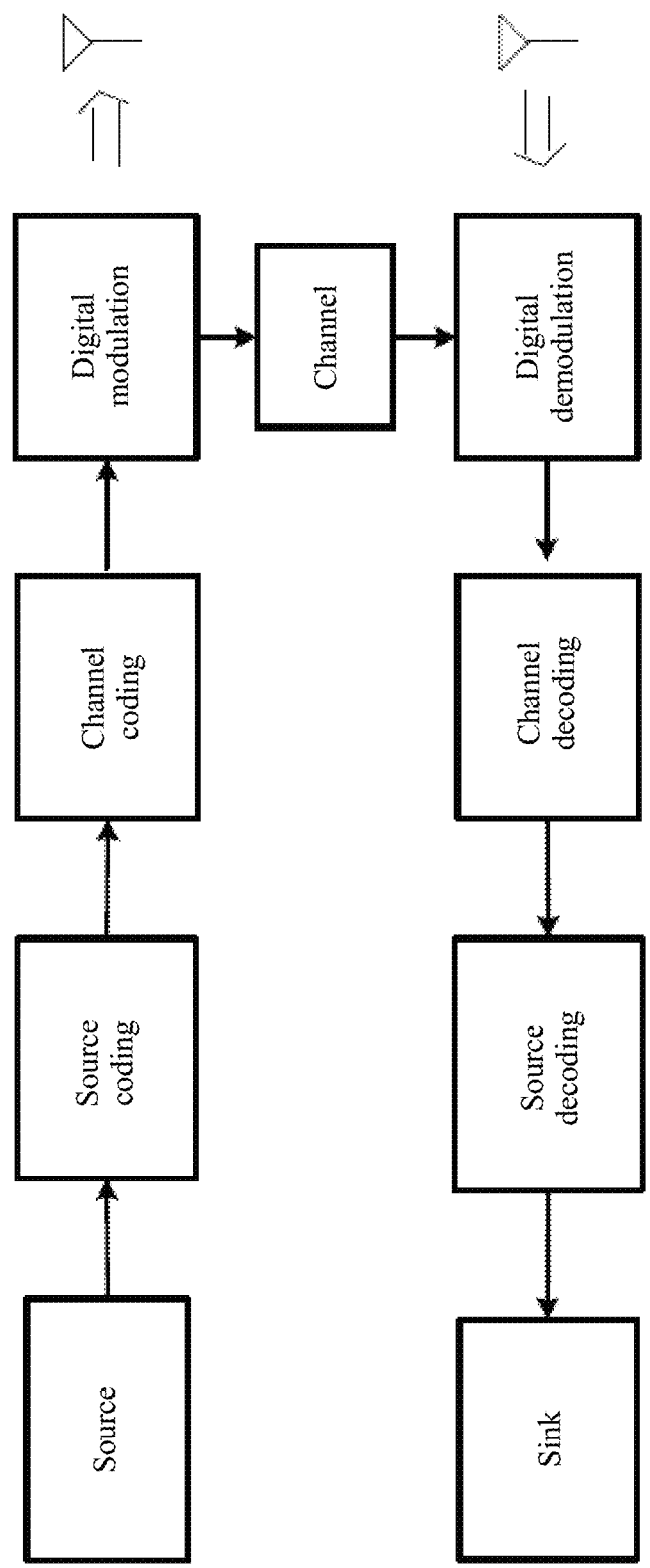
FIG. 2 is a schematic basic flowchart of wireless communication.

A wireless technology is used for communication between the network device and the terminal in FIG. 1. When the network device transmits a signal, the network device is a transmit end; or when the network device receives a signal, the network device is a receive end. Likewise, when the terminal transmits a signal, the terminal is a transmit end; or when the terminal receives a signal, the terminal is a receive end. FIG. 2 is a basic process of communication by using a wireless technology. the source undergoes source coding, channel coding, and digital modulation sequentially, and then is transmitted; and a receive end obtains a sink after receiving the signal and performing demodulation, rate dematching, channel decoding, and source decoding sequentially.

Channel coding/decoding is one of core technologies in the wireless communications field, and performance improvement of the technology directly enhances network coverage and increases a user transmission rate. Currently, as proved theoretically, polar coding is a channel coding technology that can reach a Shannon limit and have a practical encoding and decoding capabilities with linear complexity. A core of polar code construction is to enable, by using an encoding method, each sub channel to present different reliability on an encoder side by performing "channel polarization" processing. When a code length increases continuously, one part of channels tend to be noiseless channels whose capacities approach 1, and another part of channels tend to be pure noisy channels whose capacities approach 0. A channel whose capacity approaches 1 is selected for directly transmitting information, to approach a channel capacity.

An encoding policy for polar codes exactly applies a feature of the phenomenon. The policy is intended to transmit useful information of a user by using a noiseless channel, and transmit agreed information or transmit no information by using a pure noisy channel. A polar code is also a linear block code, and its coding matrix is $G_N$. An encoding process is $x_1^N = u_1^N G_N$, where $u_1^N = (u_1, u_2, K, u_N)$ is a binary row vector whose length is N (that is, a code length), $G_N$ is an N×N matrix, and $G_N = F_2^{\otimes(log_2(N))}$. $F_2^{\otimes(log_2(N))}$ is defined as a Kronecker (Kronecker) product of $log_2 N$ matrices $F_2$, where the $$F_2 = \begin{bmatrix} 1 & 0 \\ 1 & 1 \end{bmatrix}.$$

In a process of encoding a polar code, one part of bits in $u_1^N$ are used to carry information, and are referred to as a set of information bit, where a set of indexes of the bits is denoted as A; and another part of bits are set to a fixed value pre-agreed upon between the receive end and the transmit end, and are referred to as a set of fixed bits or a set of frozen bits (frozen bits), where a set of indexes of the bits is indicated by a complementary set $A^c$ of the set A of the indexes of the bits. The process of encoding the polar code is equivalent to $x_1^N = u_A G_N(A) \oplus u_{A^c} G_N(A^C)$, where GN.(A) is a sub matrix obtained from rows corresponding to the indexes in the set A in GN., and GN.(AC) is a sub matrix obtained from rows corresponding to indexes in the set $A^c$ in GN. $u_A$ is the set of the information bits in $u_i^N$, and a quantity of the information bits is K. $u_A^c$ is the set of the fixed bits in $u_1^N$, a quantity of the fixed bits is (N−K), and the fixed bits are known bits. The fixed bits are generally set to 0. However, as long as the receive end and the transmit end have pre-agreed, the fixed bits may be set randomly. Therefore, the polar code that is encoded and output may be simplified as: $x_1^N = u_A G_N(A)$, where $u_A$ is the set of the information bits in $u_1^N$, $u_A$ is a row vector whose length is K, that is, |A|=K, |•| indicates a quantity of elements in the set, K is a size of an information block, $G_N(A)$ is a sub matrix obtained from rows corresponding to the indexes in the set A in the matrix $G_N$, and $G_N(A)$ is a K×N matrix.

A process of constructing a polar code is a process of selecting a set A. The process determines performance of the polar code. A process of constructing a polar code is generally: determining, based on a code length N of a mother code, that there are a total of N polarized channels, corresponding to N rows of a coding matrix respectively; calculating reliability of the polarized channels, using indexes of first K polarized channels of higher reliability as elements of the set A, and using indexes corresponding to remaining (N−K) polarized channels as elements of a set $A^c$ of indexes of fixed bits. The set A determines positions of information bits, and the set $A^c$ determines positions of the fixed bits.

FIG. 2 is a schematic basic flowchart of common wireless communication. As shown in FIG. 2, at the transmit end, the source undergoes source coding, channel coding, and digital modulation sequentially, and then is transmitted. At the receive end, digital demodulation, channel decoding, and source decoding are performed sequentially, and then the sink is output. A polar code may be used during channel coding. However, SC decoding, SCL decoding, or the like may be used during channel decoding. To improve performance of polar codes, a plurality of technologies improved on a basis of the polar codes, for example, CA-polar codes, PC-polar codes, and CA-PC-polar, are also proposed currently.

Figure 3:
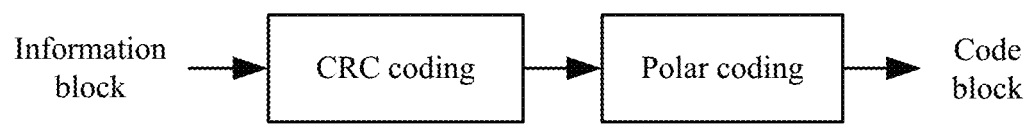
FIG. 3 is a schematic flowchart of a coding scheme in which a polar code is concatenated with a cyclic redundancy check bit.
Figure 4:
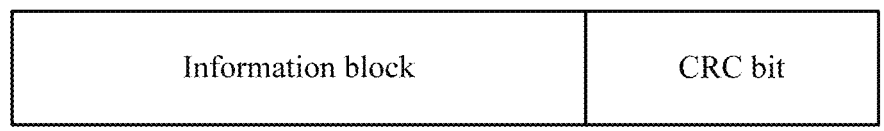
FIG. 4 is a schematic diagram of a data structure in which a polar code is concatenated with a cyclic redundancy check bit.

FIG. 3 and FIG. 4 show a coding scheme in which a polar code is concatenated with a cyclic redundancy check (Cyclic Redundancy Check) bit. This coding scheme is referred to as CA-polar for short. In a decoding process, a CRC check (Cyclic Redundancy Check, cyclic redundancy check) is performed, and a path that passes the CRC is selected from candidate paths of SCL decoding outputs as a decoding output. The decoding algorithm is referred to as a CA-SCL (CRC-Aided Successive Cancellation List) decoding algorithm. The CA-SCL decoding algorithm can significantly improve performance of polar codes.

A process of constructing a CA-polar code includes a process of determining positions of information bits. Assuming that a size of an information block is Kinfo, and that a CRC length is Kcrc, and that a code length of an encoded mother code is N, only Kinfo+Kcrc bits of highest reliability should be selected from N polarized channels as information bits, and remaining bits are used as static frozen bits (or referred to as frozen bits). In the process of constructing the CA-polar code, CRC coding is performed on the information block first, and then bits that undergo CRC coding are mapped to information bits; static frozen bits are set to fixed values agreed upon by the transmit end and the receive end; and finally Arikan polar coding is performed to obtain a CA-polar code block. The CRC bit may be concatenated at a front end or a back end of the information block, or distributed in the information block.

During decoding, neither the information block nor the CRC bit is known, and normal SCL decoding is performed. After the SCL decoding ends, L (width of path expansion) candidate decoding results are obtained, where the candidate decoding results include information blocks and CRC bits. Starting from a candidate decoding result of a path whose path metric, PM is the smallest, a CRC check is performed on each candidate decoding result. If a path passes the CRC check, an information block of the path is used as a decoding output. Otherwise, an information block of the candidate decoding result of the path whose PM is the smallest is used as a decoding output, or decoding failure is directly indicated. CA-polar may achieve a block error rate (Block Error Rate, BLER) lower than that achieved by the SCL.

In an SCL decoding process, all CRC bits are processed as information bits, and are used for path selection only when SCL decoding ends.

Figure 5:
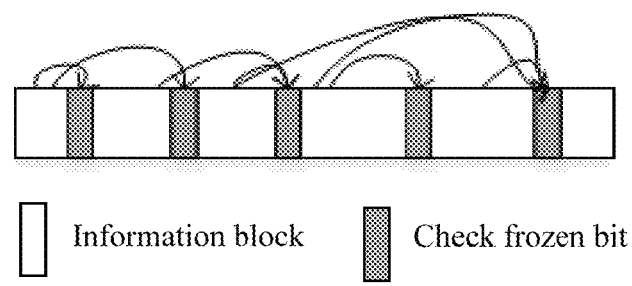
FIG. 5 is a schematic diagram of a data structure in which a polar code is concatenated with a check frozen bit.

As shown in FIG. 5, concatenating a polar code with a parity-check (Parity-check) bit, referred to as PC-polar for short, is another concatenated code construction method for improving performance of the polar code. A main idea of PC-polar is to select some check (Parity-check-frozen) bits, which are also referred to as dynamic frozen (Dynamic Frozen) bits or check frozen bits, and are distributed in an information block, where values of the check bits are determined by information bits before the check bits based on a check equation.

In PC-polar, PC coding is mainly performed on an information block to increase a minimum code distance of polar codes, and improve performance of the polar codes. PC-polar construction mainly includes two points. One is a position of a check bit, where the check bit generally should be located on a polarized channel with relatively high reliability; and the other is a check equation, that is, which information bits before each check bit determine the check bit. Once constructed, a PC-polar code is encoded in a process similar to that of CA-polar. The process includes two operations, actions, tasks, functions, etc.: PC coding and Arikan coding, where PC coding is determining a value of a check bit based on a check equation and a value of an information block, and a static frozen bit is still set to a value known by the transmit end and the receive end. A PC-polar decoding algorithm is based on an SCL decoding algorithm. Processing of an information bit and a static frozen bit is the same as processing in the SCL decoding algorithm, and a difference lies in processing of a dynamic frozen bit. Because a dynamic frozen bit is not an unknown information bit, but is determined by an information bit before the dynamic frozen bit, processing of the dynamic frozen bit is similar to processing of a static frozen bit, and a difference lies in that a value of the dynamic frozen bit is obtained through calculation based on the decoded information bit before the dynamic frozen bit. Because the dynamic frozen bit is related to the information bit before the dynamic frozen bit, this actually assists in checking an information bit decoding result. Specifically, if the decoded information bit before the dynamic frozen bit is erroneous, there is a higher possibility that the value of the dynamic frozen bit obtained through calculation does not comply with an LLR (Log likelihood ratio, log likelihood ratio) of the dynamic frozen bit. In this case, a penalty is added to a corresponding path PM, so that the erroneous path can be deleted more possibly during sorting. PC-SCL decoding finally outputs a path whose PM is the smallest.

Figure 6:
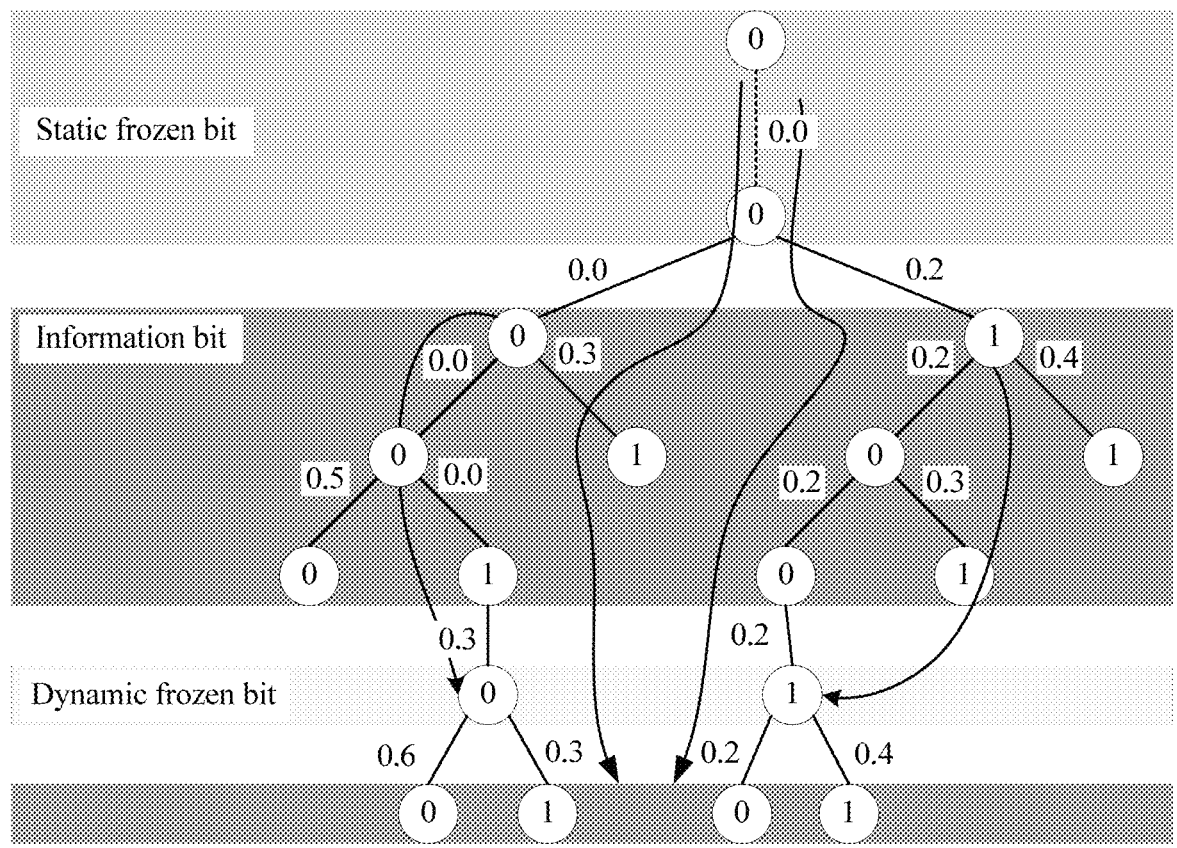
FIG. 6 is a schematic diagram of a PC-polar SCL decoding process.

FIG. 6 is an example of a PC-polar SCL decoding process. An arrow between a dynamic frozen bit and an information bit indicates a check relationship between the dynamic frozen bit and the information bit. When a dynamic frozen bit is to be decoded, in each decoding path, a value of an information bit that is obtained through decoding is used to obtain a value of the dynamic frozen bit through calculation based on a check relationship, and the value of the dynamic frozen bit is used for decoding. A position of the dynamic frozen bit in PC-polar is important for performance, and should be selected carefully during construction.

Figure 7A:
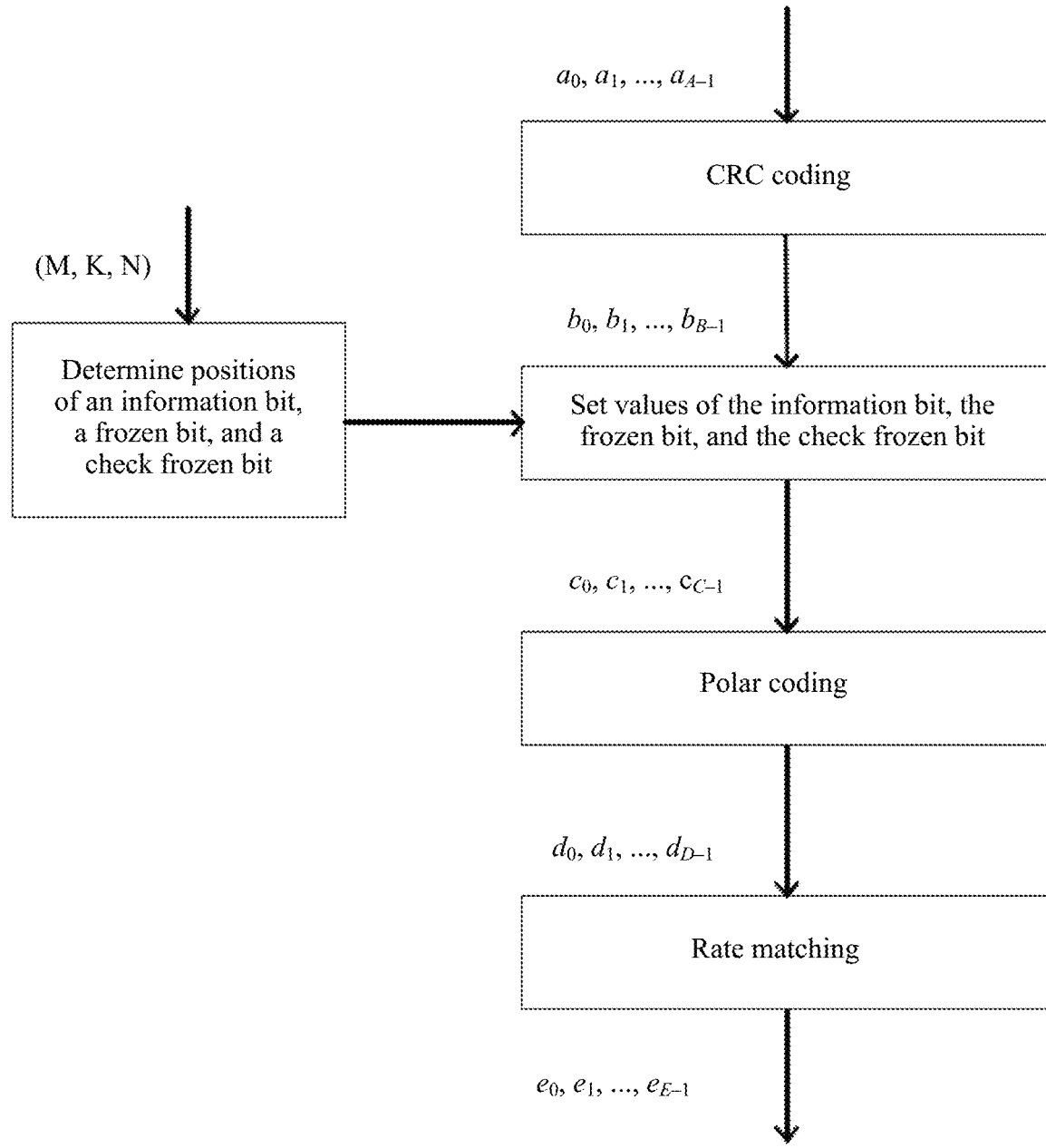
FIG. 7(a) is a schematic flowchart of CA-polar and PC-polar concatenated coding.

FIG. 7(a) is a schematic flowchart of common CA-polar and PC-polar concatenated coding. As shown in FIG. 7(a), (1) first perform concatenated cyclic redundancy check (Cyclic Redundancy Check, CRC) coding on a sequence $a_0$, $a_1$, $a_2$, . . . , $a_{A-1}$ of to-be-encoded bits to obtain $b_0$, $b_1$, . . . , $b_{B-1}$; (2) then perform PC coding, set a value of an information bit, a value of a static frozen bit, and a value of a check frozen bit respectively based on determined positions of the information bit, the static frozen bit (or referred to as a frozen bit), and the check frozen bit, and generate a sequence $c_0, c_1, \ldots, c_{C-1}$; and (3) then perform polar coding (polar coding) to obtain a sequence $d_0, d_1, d_2 \ldots, d_{D-1}$, and finally perform rate matching to obtain a sequence $e_0$, $e_1$, $e_2$ . . . , $e_{E-1}$ for transmission. A CRC coding matrix is uniquely determined by the following parameters: a quantity of CRC check bits, positions of the CRC check bits, and a CRC check equation. However, PC coding is determined by the following parameters: a position of a check frozen bit and a check equation.

A CRC-concatenated polar coding method includes the following steps: First determine positions of information bits, static frozen bits, and check bits; then perform CRC coding on a sequence of to-be-encoded bits, that is, perform CRC calculation (where A indicates a length of the information bits, and B indicates a sum of lengths of the information bits and the CRC check bits), where an input of CRC calculation is information bits $a_0, a_1, a_2, \ldots, a_{A-1}$, and generated check bits are $p_0, p_1, p_2, \ldots, p_{Kcrc-1}$; perform CRC coding in the following manner to obtain b0, b1, . . . , bB−1, where $$b_k = a_k \text{ for } k=0,1,2,\ldots,A-1; \text{ and}$$

$$b_k = p_{k-A} \text{ for } k=A, A+1, A+2, \ldots, B-1;$$

set values of information bits, static frozen bits, and check frozen bits in the CRC coding sequence b0, b1, . . . , bB−1 obtained through CRC coding, and specifically set values of the information bits, the static frozen bits, and the check frozen bits in the following manner to obtain a sequence $c_0, c_1, \ldots, c_{C-1}$ (where C indicates a length of the sequence after the information bits, the static frozen bits, and the check frozen bits are set, that is, C is equal to a length N of a mother code), where $c_i = b_j$ for $i \in$ information bit;

$c_i = 0$ for $i \in$ frozen bit; and $c_i = f(b_j)$ for $i \in$ check frozen bit, and $f(.)$ indicates a check equation;

then perform Arikan polar coding, where (D indicates a length of the sequence after Arikan polar coding, and is equal to N):

$$[d_0, d_1, d_2, \ldots, d_{D-1}] = [c_0, c_1, c_2, \ldots, c_{C-1}] \cdot F_2^{\otimes n},$$
$n = \log_2 N$; and finally, perform rate matching, and remove, from the sequence $d_0, d_1, d_2, \ldots, d_{D-1}$, a sequence that is not transmitted, to obtain a transmission sequence $e_0, e_1, e_2, \ldots, e_{E-1}$, where E indicates a length of the sequence after rate matching, that is, a code length. After being encoded, the obtained transmission sequence may be transmitted to a receiving device.

However, CRC coding and PC coding (determining the values of the check frozen bits and the check equation) in the encoding method are performed separately.

Figure 7B:
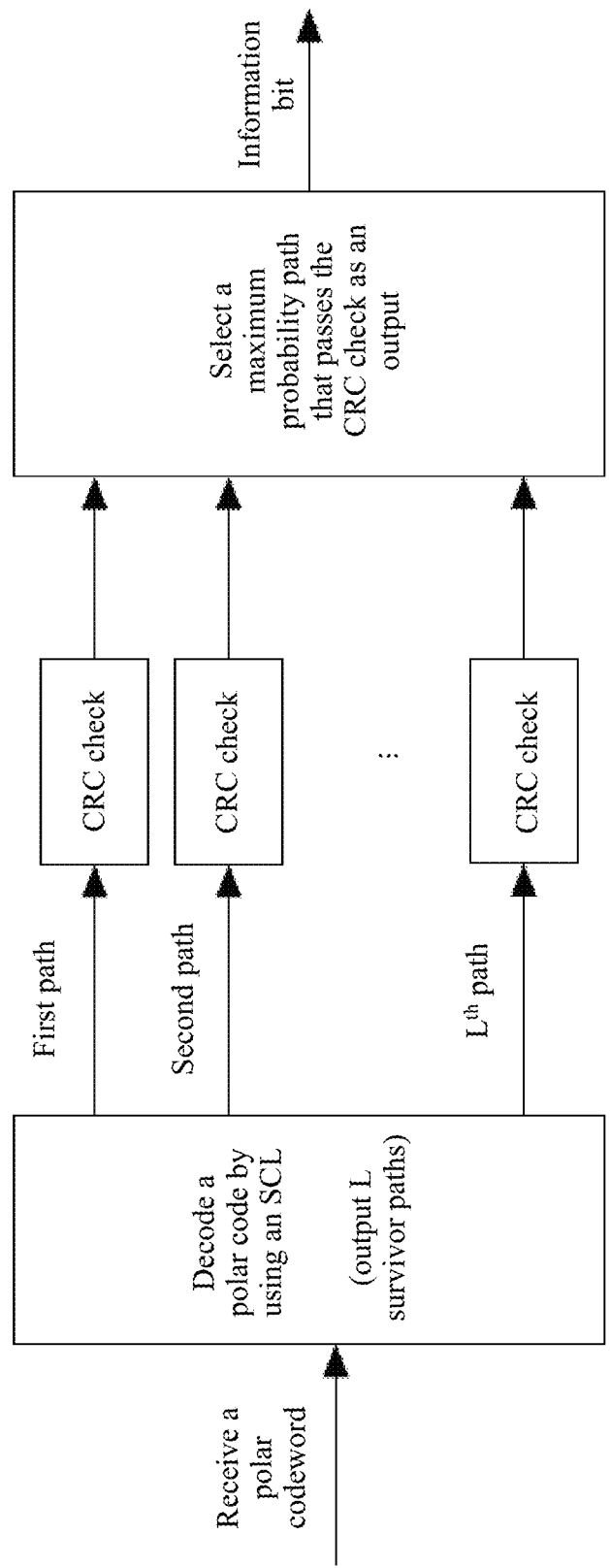
FIG. 7(b) is a schematic flowchart of decoding in CA-polar and PC-polar concatenated coding.

FIG. 7(b) is a schematic diagram of decoding in common CA-polar and PC-polar concatenated coding. As shown in FIG. 7(b), first, a polar code is decoded by using an SCL, and L survivor paths (where L is a parameter) are output; and then a CRC check is performed on the survivor paths, and a path that passes the CRC is selected as a decoding output. Herein if no path passes the CRC check, decoding fails, and a maximum probability path may be selected as an output; or if more than one path passes the CRC check, a maximum probability path is selected as an output.

The concepts or implementations described above are applicable to any one of the following embodiments.

An encoding method and a decoding method provided by this application are applied to a process of information interaction between a network device and a terminal. An encoder side may be a network device or a terminal; and correspondingly, a decoder side may be a terminal or a network device. Optionally, the methods may also be applied to a process of information interaction between terminals. This is not limited in this application.

In the following embodiment of each encoding method, an auxiliary bit is a bit that is generated dynamically on an encoder and used to provide assistance for decoding on a decoder, where the assistance for decoding is error correction, error detection, or helping determine whether to stop decoding in advance, or the like. The auxiliary bit may include at least one of a check frozen bit (which may also be referred to as a frozen check bit, a PC-frozen bit, a parity-check-frozen bit, a pre-frozen bit, a check bit, a dynamic frozen (Dynamic Frozen) bit or a PC check bit), a hash (Hash) check bit, a distributed CRC bit, and a CRC check bit.

Figure 8:
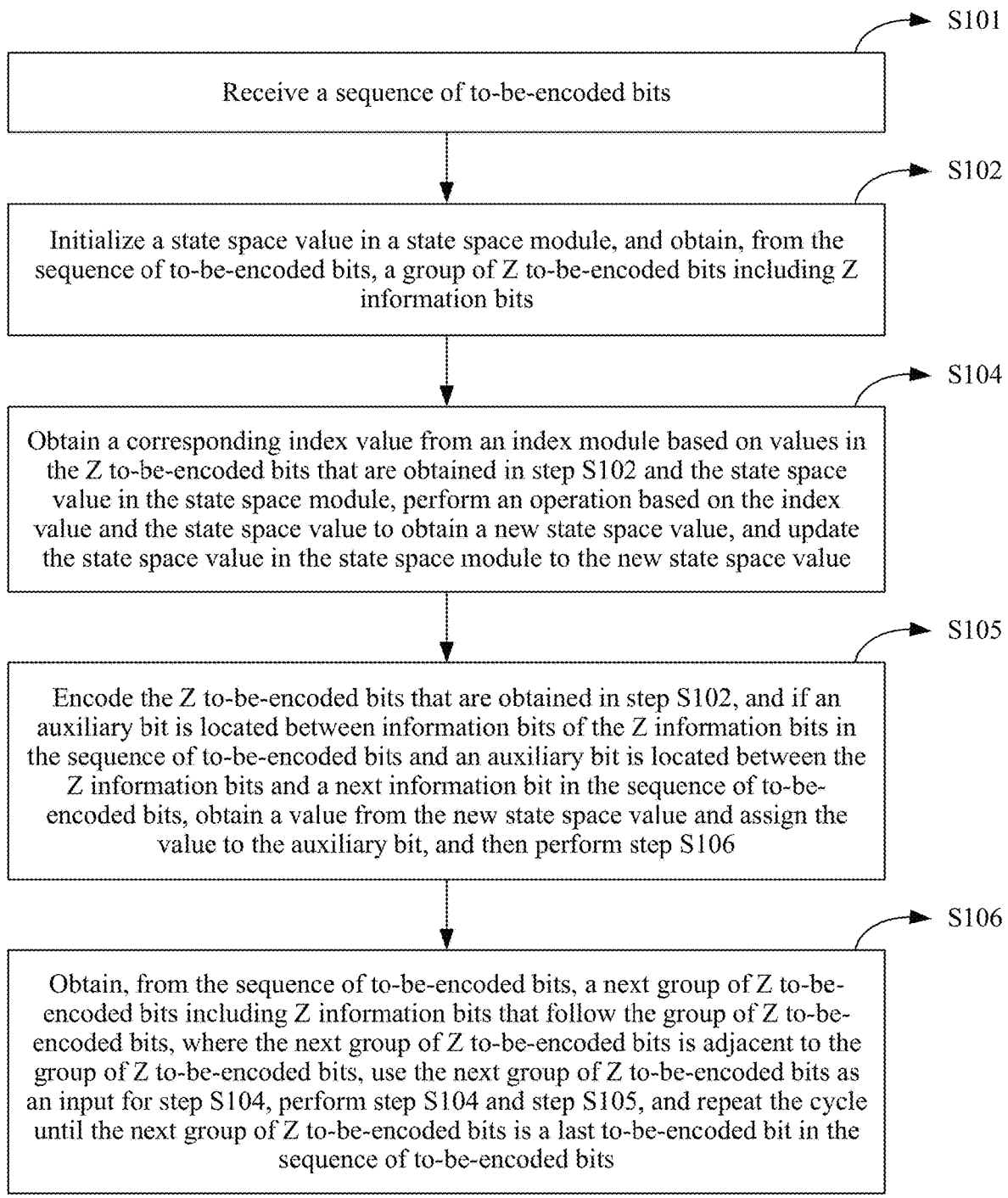
FIG. 8 is a schematic flowchart of an embodiment of an encoding method according to this application.

FIG. 8 is a schematic flowchart of an embodiment of an encoding method according to this application. As shown in FIG. 8, the encoding method specifically includes the following blocks.

S101. Receive a sequence of to-be-encoded bits.

S102. Initialize a state space value in a state space module, and obtain, from the sequence of to-be-encoded bits, a group of Z to-be-encoded bits including Z information bits.

S104. Obtain a corresponding index value from an index module based on values in the Z to-be-encoded bits that are obtained in block S102 and the state space value in the state space module, perform an operation based on the index value and the state space value to obtain a new state space value, and update the state space value in the state space module to the new state space value.

S105. Encode the Z to-be-encoded bits that are obtained in block S102, and if an auxiliary bit is located between information bits of the Z information bits in the sequence of to-be-encoded bits and an auxiliary bit is located between the Z information bits and a next information bit in the sequence of to-be-encoded bits, obtain a value from the new state space value and assign the value to the auxiliary bit, and then perform block S106.

S106. Obtain, from the sequence of to-be-encoded bits, a next group of Z to-be-encoded bits including Z information bits that follow the group of Z to-be-encoded bits, where the next group of Z to-be-encoded bits is adjacent to the group of Z to-be-encoded bits, use the next group of Z to-be-encoded bits as an input for block S104, perform block S104 and block S105, and repeat the cycle until the next group of Z to-be-encoded bits is a last to-be-encoded bit in the sequence of to-be-encoded bits.

In the embodiment of the encoding method shown in FIG. 8, for information bits in the sequence of to-be-encoded bits, Z information bits are processed every time until all information bits in the sequence of to-be-encoded bits are processed.

In the embodiment of the encoding method shown in FIG. 8, because an encoder encodes an auxiliary bit, a decoder can use the auxiliary bit to perform an assistance operation for decoding such as error correction, error detection, or early stopping on a sequence of encoded bits. In addition, because Z to-be-encoded bits are encoded every time, encoding the auxiliary bit in this block processing manner facilitates hardware implementation, and can effectively improve encoding efficiency and increase a throughput.

Figure 9:
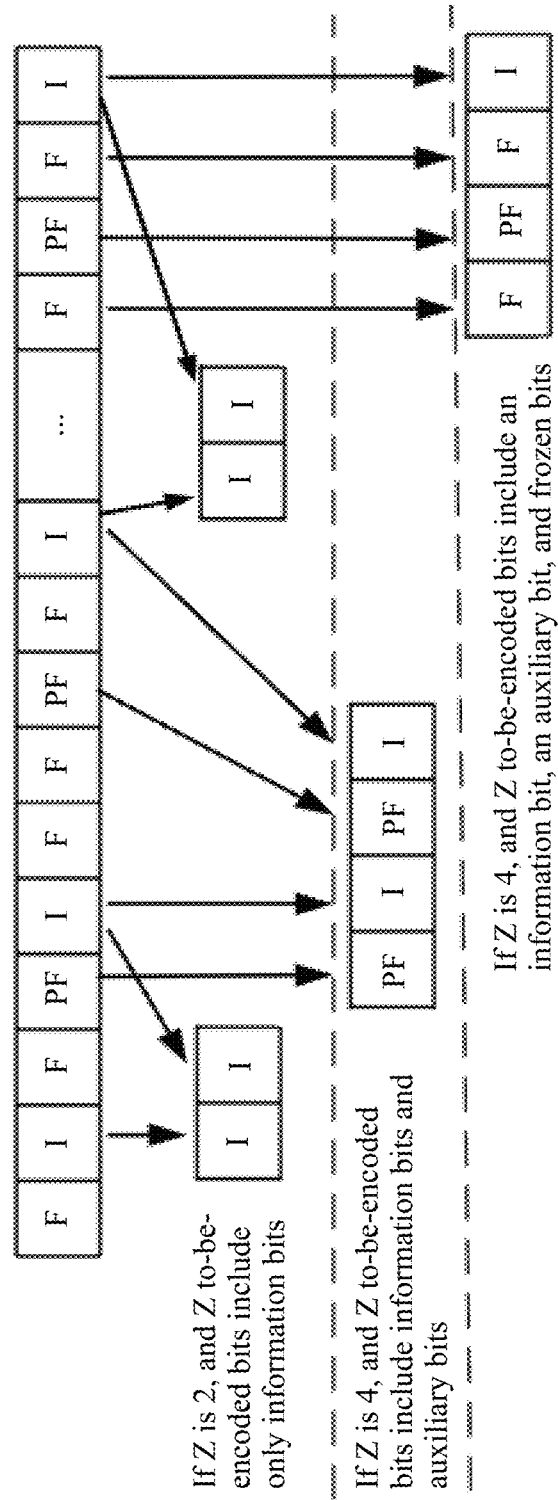
FIG. 9 is a schematic diagram of a process of extracting Z to-be-encoded bits from a sequence of to-be-encoded bits in an embodiment of an encoding method according to this application.

In the embodiment of the encoding method shown in FIG. 8, in block S106, the obtaining, from the sequence of to-be-encoded bits, a next group of Z to-be-encoded bits including Z information bits that follow the group of Z to-be-encoded bits, where the next group of Z to-be-encoded bits including Z information bits is adjacent to the group of Z to-be-encoded bits including Z information bits, is: as shown in FIG. 9, which presents a sequence of to-be-encoded bits, where F indicates a frozen bit, I indicates an information bit, and PF indicates an auxiliary bit, if Z is 2, continuously extracting information bits from the sequence of to-be-encoded bits; and after obtaining two information bits from the sequence of to-be-encoded bits, obtaining two information bits from the sequence of to-be-encoded bits again, where no information bit exists between the information bits obtained from the sequence of to-be-encoded bits this time and those obtained last time.

In the embodiment of the encoding method shown in FIG. 8, in block S102, a sequence of the Z information bits in the Z to-be-encoded bits that are obtained is consistent with a sequence of the Z information bits in the sequence of to-be-encoded bits. Specifically, as shown in FIG. 9, a sequence of to-be-encoded bits is presented in FIG. 9, where F indicates a frozen bit, I indicates an information bit, and PF indicates an auxiliary bit. If Z is 2, information bits are continuously extracted from the sequence of to-be-encoded bits. In block S105, if an auxiliary bit is located between information bits of the Z information bits in the sequence of to-be-encoded bits, as shown in FIG. 9, in a process of obtaining two information bits from the sequence of to-be-encoded bits, one auxiliary bit between the two information bits is skipped, and a value is obtained from the new state space value and assigned to the auxiliary bit. If two or more auxiliary bits are located between the two information bits, values are obtained from the new state space value and assigned to the two or more auxiliary bits. If an auxiliary bit is located between the Z information bits and a next information bit in the sequence of to-be-encoded bits, as shown in FIG. 9, after two information bits are obtained from the sequence of to-be-encoded bits, when two information bits are obtained from the sequence of to-be-encoded bits again, one auxiliary bit is skipped, and a value is obtained from the new state space value and assigned to the auxiliary bit. If two or more auxiliary bits are located between the information bits obtained this time and those obtained last time, values are obtained from the new state space value and assigned to the two or more auxiliary bits.

In the embodiment of the encoding method shown in FIG. 8, the obtaining a value from the new state space value and assigning the value to the auxiliary bit if an auxiliary bit is located between information bits of the Z information bits in the sequence of to-be-encoded bits and an auxiliary bit is located between the Z information bits and a next information bit in the sequence of to-be-encoded bits includes: obtaining a value from the new state space value and assigning the value to the auxiliary bit between the information bits of the Z information bits and the auxiliary bit between the Z information bits and the next information bit separately. The value assigned to the auxiliary bit between the information bits of the Z information bits and the value assigned to the auxiliary bit between the Z information bits and the next information bit may be obtained from a same position in the new state space value or obtained from different positions in the new state space value. Generally, the values assigned to the two auxiliary bits may be the same or may be different.

In the embodiment of the encoding method shown in FIG. 8, that the next group of Z to-be-encoded bits is a last to-be-encoded bit in the sequence of to-be-encoded bits in block S106 is:

a quantity of finally remaining information bits in the sequence of to-be-encoded bits is less than or equal to Z; and if the quantity of finally remaining information bits in the sequence of to-be-encoded bits is less than Z, an insufficient part is filled in with a fixed value 0 or 1.

In the embodiment of the encoding method shown in FIG. 8, block S104 may be performed before block S105.

In the embodiment of the encoding method shown in FIG. 8, before block S104, the method further includes:

precoding $2^Z$ permutations and combinations of the Z to-be-encoded bits in the sequence of to-be-encoded bits, and storing a precoding result in the index module. A coding scheme used in the precoding is consistent with a coding scheme used in the encoding in block S105, and the precoding is preprocessing of the encoding in block S105. Specifically, the precoding result may be a precoding value, and the precoding value is stored as an index value in the index module. The index value in the index module may be stored in a form of an index table. Specifically, the index value may be stored in the index module in a manner of offline storage.

The coding scheme in the encoding in block S105 may be considered as a target encoding method in the embodiment of the encoding method. To be specific, the coding scheme in the encoding in block S105 may be considered as an encoding method intended to be used in the embodiment of the encoding method.

In the embodiment of the encoding method shown in FIG. 8, in block S105, in the block of encoding the Z to-be-encoded bits that are obtained in block S102, the encoding is encoding in a check coding scheme or encoding in an information digest coding scheme or encoding in a linear operation. The encoding in the check coding scheme may be CRC coding or PC coding. The encoding in the information digest coding scheme may be hash (Hash) coding, or the like. The encoding in the linear operation scheme may be encoding by using a coding matrix.

In the embodiment of the encoding method shown in FIG. 8, the obtaining a corresponding index value from an index module based on values in the Z to-be-encoded bits that are obtained in block S102 and the state space value in the state space module in block S104 includes:

performing an operation between Z least significant bits of the state space value and the values in the Z to-be-encoded bits that are obtained in block S102 to obtain an index ID, and obtaining, by using the index ID, the index value stored in the index module.

In the embodiment of the encoding method shown in FIG. 8, the performing an operation based on the index value and the state space value in block S104 includes:

performing a bitwise logical operation between the index value and the state space value.

The specific bitwise logical operation may be a bitwise XOR operation, or a bitwise AND operation, or a bitwise OR operation, or a bitwise NAND operation, or the like.

The performing a bitwise logical operation between the index value and the state space value may be specifically: performing a bitwise logical operation between the index value and the Z least significant bits of the state space value.

In the embodiment of the encoding method shown in FIG. 8, if CRC coding or PC coding is used, the performing an operation based on the index value and the state space value in block S104 includes: performing a bitwise XOR (XOR) operation between the index value and the state space value.

In the embodiment of the encoding method shown in FIG. 8, the obtaining a corresponding index value from an index module based on values in the Z to-be-encoded bits that are obtained in block S102 and the state space value in the state space module in block S104 includes:

S1041. cyclically shifting the state space value in a fixed direction (for example, left or right) by Z bits, then performing an operation between Z least significant bits of the state space value and the values in the Z to-be-encoded bits that are obtained in block S102 to obtain an index ID, and obtaining, by using the index ID, the index value stored in the index module; and correspondingly, the performing an operation based on the index value and the state space value in block S104 includes:

S1042. performing a bitwise logical operation between the index value and the state space value, for example, performing a bitwise logical operation between the index value and the Z least significant bits of the state space value.

In the embodiment of the encoding method shown in FIG. 8, the state space module may be specifically a CRC register group. Storage space of the CRC register group is determined based on a type of CRC used in encoding. Generally, the storage space of the CRC register group may be twice a CRC length. If the CRC length is Z bits, the storage space of the CRC register group may be 2Z bits, and Z to-be-encoded bits may be processed every time.

In block S104, the obtaining a corresponding index value from an index module based on values in the Z to-be-encoded bits that are obtained in block S102 and the state space value in the state space module may further include:

S1043. performing an XOR operation between Z most significant bits in the CRC register group and the values in the Z to-be-encoded bits that are obtained in block S102 to obtain an index ID, and obtaining the corresponding index value in the index module by using the index ID; and correspondingly, the performing an operation based on the index value and the state space value in block S104 includes:

S1044. cyclically shifting all bits in the CRC register group in a fixed direction (for example, left or right) by Z bits, and then performing an XOR operation between the index value and Z least significant bits in the CRC register group to obtain a new state space value.

Correspondingly, in the process of obtaining a value from the new state space value and assigning the value to the auxiliary bit in block S105, the auxiliary bit is a PC check bit.

Figure 10:
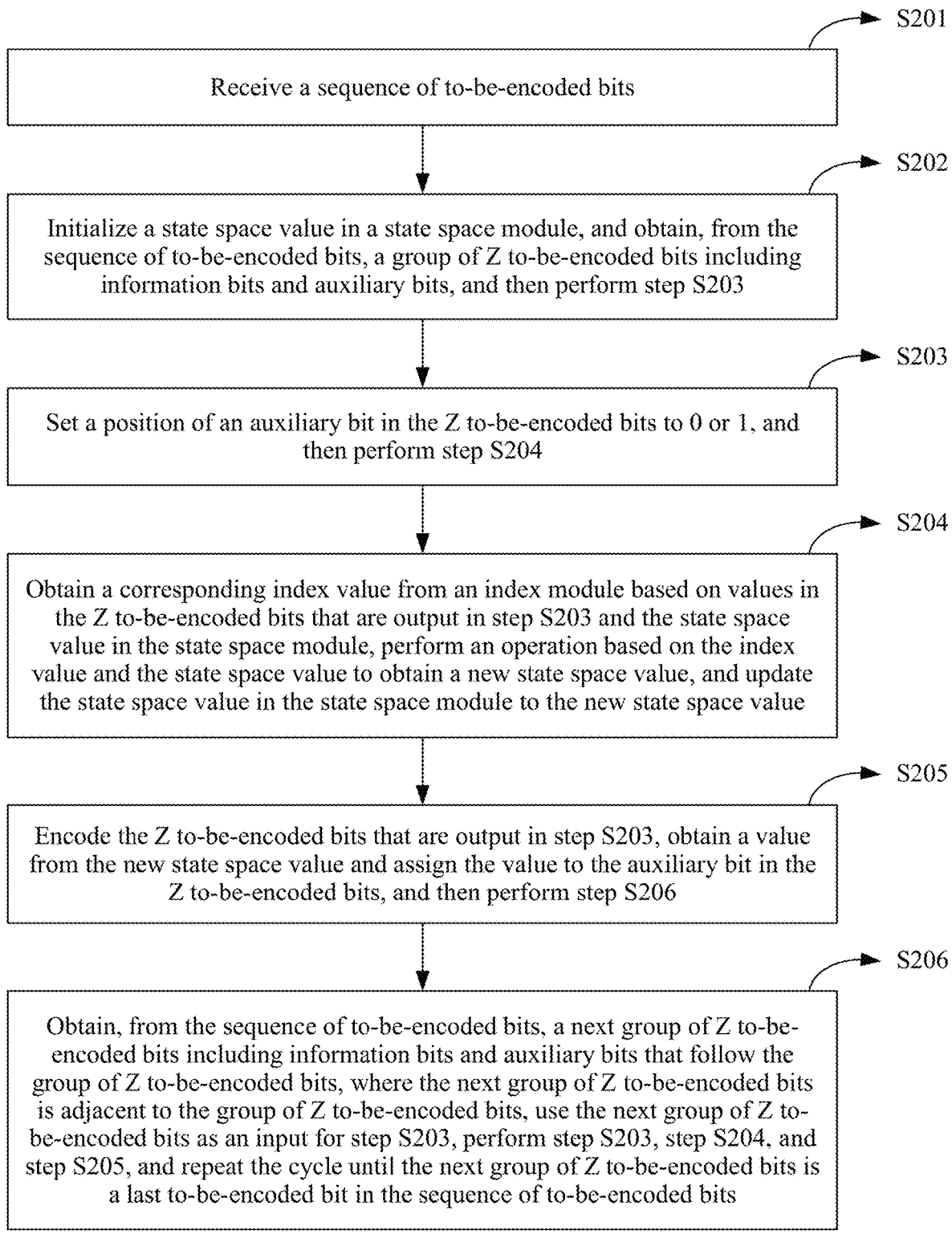
FIG. 10 is a schematic flowchart of an embodiment of another encoding method according to this application.

FIG. 10 is a schematic flowchart of an embodiment of another encoding method according to this application. As shown in FIG. 10, the encoding method specifically includes the following blocks.

S201. Receive a sequence of to-be-encoded bits.

S202. Initialize a state space value in a state space module, and obtain, from the sequence of to-be-encoded bits, a group of Z to-be-encoded bits including information bits and auxiliary bits, and then perform block S203.

S203. Set a position of an auxiliary bit in the Z to-be-encoded bits to a fixed value, and then perform block S204.

S204. Obtain a corresponding index value from an index module based on values in the Z to-be-encoded bits that are output in block S203 and the state space value in the state space module, perform an operation based on the index value and the state space value to obtain a new state space value, and update the state space value in the state space module to the new state space value.

S205. Encode the Z to-be-encoded bits that are output in block S203, obtain a value from the new state space value and assign the value to the auxiliary bit in the Z to-be-encoded bits, and then perform block S206.

S206. Obtain, from the sequence of to-be-encoded bits, a next group of Z to-be-encoded bits including information bits and auxiliary bits that follow the group of Z to-be-encoded bits, where the next group of Z to-be-encoded bits is adjacent to the group of Z to-be-encoded bits, use the next group of Z to-be-encoded bits as an input for block S203, perform block S203, block S204, and block S205, and repeat the cycle until the next group of Z to-be-encoded bits is a last to-be-encoded bit in the sequence of to-be-encoded bits.

In the embodiment of the encoding method shown in FIG. 10, for information bits and auxiliary bits in the sequence of to-be-encoded bits, Z to-be-encoded bits that are processed every time include both information bits and auxiliary bits, and information bits and auxiliary bits in the sequence of to-be-encoded bits are continuously extracted until all information bits and auxiliary bits in the sequence of to-be-encoded bits are processed.

In the embodiment of the encoding method shown in FIG. 10, because an encoder encodes an auxiliary bit, a decoder can use the auxiliary bit to perform an assistance operation for decoding such as error correction, error detection, or early stopping on a sequence of encoded bits. In addition, because Z to-be-encoded bits are encoded every time, encoding the auxiliary bit in this block processing manner facilitates hardware implementation, and can effectively improve encoding efficiency and increase a throughput.

In the embodiment of the encoding method shown in FIG. 10, in block S202, a sequence of the information bits and the auxiliary bits in the Z to-be-encoded bits that are obtained is consistent with a sequence of the information bits and the auxiliary bits in the sequence of to-be-encoded bits. Specifically, as shown in FIG. 9, if Z is 4, the information bits and the auxiliary bits are continuously extracted from the sequence of to-be-encoded bits.

In the embodiment of the encoding method shown in FIG. 10, in block S206, the obtaining, from the sequence of to-be-encoded bits, a next group of Z to-be-encoded bits including information bits and auxiliary bits that follow the group of Z to-be-encoded bits, where the next group of Z to-be-encoded bits is adjacent to the group of Z to-be-encoded bits, is: as shown in FIG. 9, if Z is 4, continuously extracting information bits and auxiliary bits from the sequence of to-be-encoded bits; and after continuously obtaining information bits and auxiliary bits from the sequence of to-be-encoded bits, obtaining information bits and auxiliary bits from the sequence of to-be-encoded bits again, where neither an information bit nor an auxiliary bit exists between four to-be-encoded bits obtained from the sequence of to-be-encoded bits this time and four to-be-encoded bits obtained last time.

In the embodiment of the encoding method shown in FIG. 10, that the next group of Z to-be-encoded bits is a last to-be-encoded bit in the sequence of to-be-encoded bits in block S206 is:

a total quantity of information bits and auxiliary bits in finally remaining bits in the sequence of to-be-encoded bits is less than or equal to Z; and if the total quantity of information bits and auxiliary bits in the finally remaining bits in the sequence of to-be-encoded bits is less than Z, an insufficient part is filled in with a fixed value 0 or 1.

In the embodiment of the encoding method shown in FIG. 10, in block S203, values of positions of the information bits do not should be changed.

In the embodiment of the encoding method shown in FIG. 10, block S204 may be performed before block S205.

In the embodiment of the encoding method shown in FIG. 10, before block 204, the method further includes:

precoding $2^z$ permutations and combinations of the Z to-be-encoded bits in the sequence of to-be-encoded bits, and storing a precoding result in the index module. A coding scheme used in the precoding is consistent with a coding scheme used in the encoding in block S205, and the precoding is preprocessing of the encoding in block S205. Specifically, the precoding result may be a precoding value, and the precoding value is stored as an index value in the index module. The index value in the index module may be stored in a form of an index table. Specifically, the index value may be stored in the index module in a manner of offline storage.

The precoding is processing the Z to-be-encoded bits that are not processed in block S203. The coding scheme in the encoding in block S205 may be considered as a target encoding method in the embodiment of the encoding method. To be specific, the coding scheme in the encoding in block S205 may be considered as an encoding method intended to be used in the embodiment of the encoding method.

In the embodiment of the encoding method shown in FIG. 10, in block S205, in the block of encoding the Z to-be-encoded bits that are output in block S203, the encoding is encoding in a check coding scheme or encoding in an information digest coding scheme or encoding in a linear operation. The encoding in the check coding scheme may be CRC coding or PC coding. The encoding in the information digest coding scheme may be hash (Hash) coding, or the like. The encoding in the linear operation scheme may be encoding by using a coding matrix.

In the embodiment of the encoding method shown in FIG. 10, the obtaining a corresponding index value from an index module based on values in the Z to-be-encoded bits that are output in block S203 and the state space value in the state space module in block S204 includes:

performing an operation between Z least significant bits of the state space value and the values in the Z to-be-encoded bits that are output in block S203 to obtain an index ID, and obtaining, by using the index ID, the index value stored in the index module.

In the embodiment of the encoding method shown in FIG. 10, the performing an operation based on the index value and the state space value in block S204 includes:

performing a bitwise logical operation between the index value and the state space value.

The specific bitwise logical operation may be a bitwise XOR operation, or a bitwise AND operation, or a bitwise OR operation, or a bitwise NAND operation, or the like.

The performing a bitwise logical operation between the index value and the state space value may be specifically: performing a bitwise logical operation between the index value and the Z least significant bits of the state space value.

In the embodiment of the encoding method shown in FIG. 10, if CRC coding or PC coding is used, the performing an operation based on the index value and the state space value in block S204 includes: performing a bitwise XOR (XOR) operation between the index value and the state space value.

In the embodiment of the encoding method shown in FIG. 10, the obtaining a corresponding index value from an index module based on values in the Z to-be-encoded bits that are output in block S203 and the state space value in the state space module in block S204 includes:

S2041. cyclically shifting the state space value in a fixed direction (for example, left or right) by Z bits, then performing an operation between Z least significant bits of the state space value and the values in the Z to-be-encoded bits that are output in block S203 to obtain an index ID, and obtaining, by using the index ID, the index value stored in the index module; and correspondingly, the performing an operation based on the index value and the state space value in block S204 includes:

S2042. performing a bitwise logical operation between the index value and the state space value, for example, performing a bitwise logical operation between the index value and the Z least significant bits of the state space value.

In the embodiment of the encoding method shown in FIG. 10, the state space module may be specifically a CRC register group. Storage space of the CRC register group is determined based on a type of CRC used in encoding. Generally, the storage space of the CRC register group may be twice a CRC length. If the CRC length is Z bits, the storage space of the CRC register group may be 2Z bits, and Z to-be-encoded bits may be processed every time.

In block S204, the obtaining a corresponding index value from an index module based on values in the Z to-be-encoded bits that are output in block S203 and the state space value in the state space module may further include:

S2043. performing an XOR operation between Z most significant bits in the CRC register group and the values in the Z to-be-encoded bits that are output in block S203 to obtain an index ID, and obtaining the corresponding index value in the index module by using the index ID; and correspondingly, the performing an operation based on the index value and the state space value in block S204 includes:

S2044. cyclically shifting all bits in the CRC register group in a fixed direction (for example, left or right) by Z bits, and then performing an XOR operation between the index value and Z least significant bits in the CRC register group to obtain a new state space value.

Correspondingly, in the process of obtaining a value from the new state space value and assigning the value to the auxiliary bit in block S205, the auxiliary bit is a PC check bit.

Figure 11:
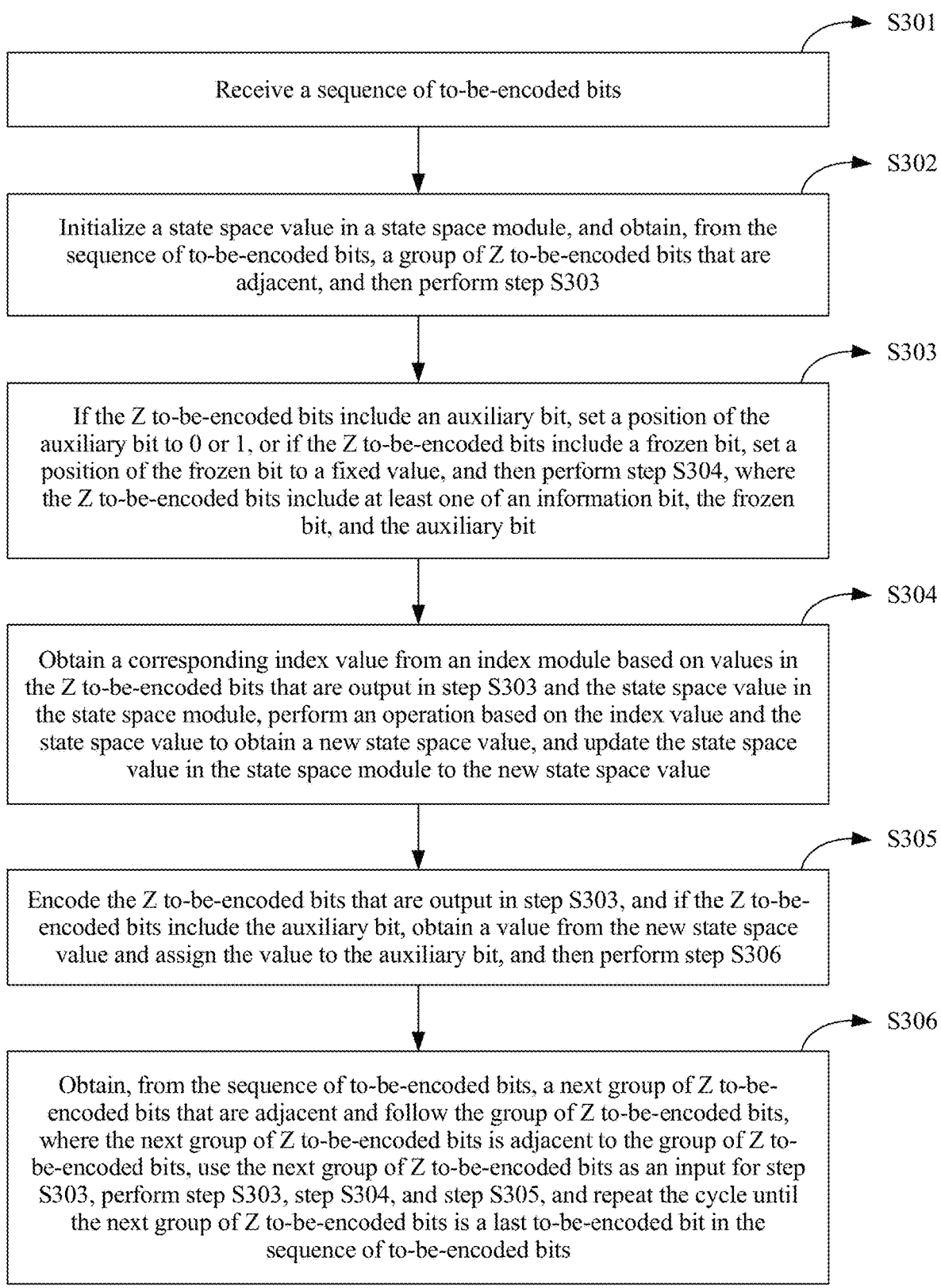
FIG. 11 is a schematic flowchart of an embodiment of still another encoding method according to this application.

FIG. 11 is a schematic flowchart of an embodiment of still another encoding method according to this application. As shown in FIG. 11, the encoding method specifically includes the following blocks.

S301. Receive a sequence of to-be-encoded bits.

S302. Initialize a state space value in a state space module, and obtain, from the sequence of to-be-encoded bits, a group of Z to-be-encoded bits that are adjacent, and then perform block S303.

S303. If the Z to-be-encoded bits include an auxiliary bit, set a position of the auxiliary bit to a fixed value, or if the Z to-be-encoded bits include a frozen bit, set a position of the frozen bit to a fixed value, and then perform block S304, where the Z to-be-encoded bits include at least one of an information bit, the frozen bit, and the auxiliary bit.

S304. Obtain a corresponding index value from an index module based on values in the Z to-be-encoded bits that are output in block S303 and the state space value in the state space module, perform an operation based on the index value and the state space value to obtain a new state space value, and update the state space value in the state space module to the new state space value.

S305. Encode the Z to-be-encoded bits that are output in block S303, and if the Z to-be-encoded bits include the auxiliary bit, obtain a value from the new state space value and assign the value to the auxiliary bit, and then perform block S306.

S306. Obtain, from the sequence of to-be-encoded bits, a next group of Z to-be-encoded bits that are adjacent and follow the group of Z to-be-encoded bits, where the next group of Z to-be-encoded bits is adjacent to the group of Z to-be-encoded bits, use the next group of Z to-be-encoded bits as an input for block S303, perform block S303, block S304, and block S305, and repeat the cycle until the next group of Z to-be-encoded bits is a last to-be-encoded bit in the sequence of to-be-encoded bits.

In the embodiment of the encoding method shown in FIG. 11, for information bits, frozen bits, and auxiliary bits in the sequence of to-be-encoded bits, Z bits are continuously extracted from the sequence of to-be-encoded bits for processing every time until all bits in the sequence of to-be-encoded bits are processed. The Z to-be-encoded bits may include one or more of the information bits, the frozen bits, and the auxiliary bits.

In the foregoing embodiment of this application, because an encoder encodes an auxiliary bit, a decoder can use the auxiliary bit to perform an assistance operation for decoding such as error correction, error detection, or early stopping on a sequence of encoded bits. In addition, because Z to-be-encoded bits are encoded every time, encoding the auxiliary bit in this block processing manner facilitates hardware implementation, and can effectively improve encoding efficiency and increase a throughput.

In the embodiment of the encoding method shown in FIG. 11, in block S302, a sequence of information bits, auxiliary bits, and frozen bits in the Z to-be-encoded bits that are obtained is consistent with a sequence of the information bits, the auxiliary bits, and the frozen bits in the sequence of to-be-encoded bits. Specifically, as shown in FIG. 9, if Z is 4, the information bits, the auxiliary bits, and the frozen bits are continuously extracted from the sequence of to-be-encoded bits.

In the embodiment of the encoding method shown in FIG. 11, that the next group of Z to-be-encoded bits being adjacent is a last to-be-encoded bit in the sequence of to-be-encoded bits in block S306 is:

a quantity of finally remaining to-be-encoded bits in the sequence of to-be-encoded bits is less than or equal to Z; and if the quantity of finally remaining to-be-encoded bits in the sequence of to-be-encoded bits is less than Z, an insufficient part is filled in with a fixed value 0 or 1.

In the embodiment of the encoding method shown in FIG. 11, in block S303, the position of the frozen bit is set to the fixed value, and the fixed value is a fixed value agreed upon between an encoder side (or encoder) and a decoder side (or decoder).

In the embodiment of the encoding method shown in FIG. 11, in block S303, a value of a position of the information bit does not should be changed.

In the embodiment of the encoding method shown in FIG. 11, block S304 may be performed before block S305.

In the embodiments of the encoding methods shown in FIG. 10 and FIG. 11, in block S203 and block S303, the position of the auxiliary bit may be set to a value agreed upon between the encoder side (or encoder) and the decoder side (or decoder), and the value may be 0 or may be 1.

In the foregoing embodiment of each encoding method, a transmitting device encodes the sequence of to-be-encoded bits to obtain a sequence of encoded bits, where the sequence of encoded bits includes an information bit, a frozen bit, and an auxiliary bit, and a value of the auxiliary bit is obtained by using the state space value.

In the foregoing embodiment of each encoding method, Z is an even number greater than 0.

In the foregoing embodiment of each encoding method, the state space module may be specifically in a form of a register, for example, a register group.

In the foregoing embodiment of each encoding method, in the block of initializing a state space value in a state space module, the initialized value in the state space module is a value agreed upon between the encoder side (or encoder) and the decoder side (or decoder). For example, the initialized value may be all 0s, or any fixed sequence agreed upon between the encoder side and the decoder side. Specifically, the state space module may be implemented by a register group. When a state of the register group is initialized to all 1 s, in the operation of obtaining a value from the new state space value and assigning the value to the auxiliary bit in blocks S105, S205, and S305, the new state space value should be negated, and then a value of at least one position in the new state space value is assigned to the auxiliary bit.

In the embodiments of the encoding methods in FIG. 8, FIG. 10, or FIG. 11, the block of obtaining a value from the new state space value and assigning the value to the auxiliary bit in the process of performing blocks S105, S205, or S305 may include: assigning a value of at least one position in the new state space value to the auxiliary bit.

In the embodiments of the encoding methods in FIG. 8, FIG. 10, and FIG. 11, in a process of performing blocks S105, S205, and S305 for different Z to-be-encoded bits for a plurality of times, the block of obtaining a value from the new state space value and assigning the value to the auxiliary bit for a plurality of times may include: obtaining a value from a fixed position in the state space module each time and assigning the value to the auxiliary bit; or in a cyclic shift manner, starting from a position in a fixed direction, selecting a value from a position that is replaced successively in the state space module and assigning the value to the auxiliary bit; or in a pseudo random manner, selecting a value from the state space module and assigning the value to the auxiliary bit; or selecting a value from a position in the state space module and assigning the value to the auxiliary bit, where the position is calculated by using a function (for example, a relationship function between a storage space size of the state space module and a sequence number of the auxiliary bit).

In the embodiment of the encoding method shown in FIG. 11, before block S304, the method further includes:

precoding $2^Z$ permutations and combinations of the Z to-be-encoded bits in the sequence of to-be-encoded bits, and storing a precoding result in the index module. A coding scheme used in the precoding is consistent with a coding scheme used in the encoding in block S305, and the precoding is preprocessing of the encoding in block S305. Specifically, the precoding result may be a precoding value, and the precoding value is stored as an index value in the index module. The index value in the index module may be stored in a form of an index table. Specifically, the index value may be stored in the index module in a manner of offline storage.

The precoding is processing the Z to-be-encoded bits that are not processed in block S303. The coding scheme in the encoding in block S305 may be considered as a target encoding method in the embodiment of the encoding method. To be specific, the coding scheme in the encoding in block S305 may be considered as an encoding method intended to be used in the embodiment of the encoding method.

In the embodiment of the encoding method shown in FIG. 11, in block S305, in the block of encoding the Z to-be-encoded bits that are output in block S303, the encoding is encoding in a check coding scheme or encoding in an information digest coding scheme or encoding in a linear operation. The encoding in the check coding scheme may be CRC coding or PC coding. The encoding in the information digest coding scheme may be hash (Hash) coding, or the like. The encoding in the linear operation scheme may be encoding by using a coding matrix.

In the embodiment of the encoding method shown in FIG. 11, the obtaining a corresponding index value from an index module based on values in the Z to-be-encoded bits that are output in block S303 and the state space value in the state space module in block S304 includes:

performing an operation between Z least significant bits of the state space value and the values in the Z to-be-encoded bits that are output in block S303 to obtain an index ID, and obtaining, by using the index ID, the index value stored in the index module.

In the embodiment of the encoding method shown in FIG. 11, the performing an operation based on the index value and the state space value in block S304 includes:

performing a bitwise logical operation between the index value and the state space value.

The specific bitwise logical operation may be a bitwise XOR operation, or a bitwise AND operation, or a bitwise OR operation, or a bitwise NAND operation, or the like.

The performing a bitwise logical operation between the index value and the state space value may be specifically: performing a bitwise logical operation between the index value and the Z least significant bits of the state space value.

In the embodiment of the encoding method shown in FIG. 11, if CRC coding or PC coding is used, the performing an operation based on the index value and the state space value in block S304 includes: performing a bitwise XOR (XOR) operation between the index value and the state space value.

In the embodiment of the encoding method shown in FIG. 11, the obtaining a corresponding index value from an index module based on values in the Z to-be-encoded bits that are output in block S303 and the state space value in the state space module in block S304 includes:

S3041. cyclically shifting the state space value in a fixed direction (for example, left or right) by Z bits, then performing an operation between Z least significant bits of the state space value and the values in the Z to-be-encoded bits that are output in block S303 to obtain an index ID, and obtaining, by using the index ID, the index value stored in the index module; and correspondingly, the performing an operation based on the index value and the state space value in block S304 includes:

S3042. performing a bitwise logical operation between the index value and the state space value, for example, performing a bitwise logical operation between the index value and the Z least significant bits of the state space value.

In the embodiment of the encoding method shown in FIG. 11, the state space module may be specifically a CRC register group. Storage space of the CRC register group is determined based on a type of CRC used in encoding. Generally, the storage space of the CRC register group may be twice a CRC length. If the CRC length is Z bits, the storage space of the CRC register group may be 2Z bits, and Z to-be-encoded bits may be processed every time.

In block S304, the obtaining a corresponding index value from an index module based on values in the Z to-be-encoded bits that are output in block S303 and the state space value in the state space module may further include:

S3043. performing an XOR operation between Z most significant bits in the CRC register group and the values in the Z to-be-encoded bits that are output in block S303 to obtain an index ID, and obtaining the corresponding index value in the index module by using the index ID; and correspondingly, the performing an operation based on the index value and the state space value in block S304 includes:

S3044. cyclically shifting all bits in the CRC register group in a fixed direction (for example, left or right) by Z bits, and then performing an XOR operation between the index value and Z least significant bits in the CRC register group to obtain a new state space value.

Correspondingly, in the process of obtaining a value from the new state space value and assigning the value to the auxiliary bit in block S305, the auxiliary bit is a PC check bit.

In the embodiments of the encoding methods in FIG. 8, FIG. 10, and FIG. 11, after block S106, or block S206, or block S306, the method further includes:

S3060. using the last to-be-encoded bit in the sequence of to-be-encoded bits as an input for block S303, and after performing block S303, block S304, and block S305, using an obtained state space value in the state space module as a CRC check bit, and performing CRC coding, where in the process of obtaining a value from the new state space value and assigning the value to the auxiliary bit in block S305, block S205, or block S105, the auxiliary bit may be a PC check bit. Therefore, with reference to block S3060, in the foregoing embodiment of this application, different types of auxiliary bits in a system can be encoded simultaneously, hardware overheads are reduced, and encoding efficiency is improved.

In the embodiments of the encoding methods in FIG. 8, FIG. 10, and FIG. 11, after block S106, or block S206, or block S306, the method further includes:

S307. performing polar coding and rate matching on the sequence of encoded bits to obtain a rate-matched sequence for transmission; and S308. transmitting the rate-matched sequence.

In the embodiments of the encoding methods in FIG. 8, FIG. 10, and FIG. 11, block S307 and block S308 are performed after block S3060 is performed.

The following provides a specific example. Various specific features in the example may be all incorporated into the foregoing embodiment independently.

In the example, a 17-bit polynomial is used for generating the state space value, and the state space value is located in a 16-bit (2-byte) state space module. In the process of updating the state space value, eight bits (that is, if Z is 8 in the foregoing embodiment), that is, one byte, is used as a unit for updating.

The process of updating the state space value includes:

initializing the state space value in the state space module to all 0s, or any fixed sequence agreed upon between the encoder side and the decoder side;

cyclically left-shifting the state space value in the state space module by eight bits, and saving the state space value;

performing an operation between eight least significant bits of the state space value in the state space module and eight to-be-encoded bits to obtain a corresponding index value mapped to an index table; and performing an operation between the index value in the index table and the state space value in the state space module to obtain a new state space value, and updating the state space value in the state space module to the new state space value.

In the foregoing block (2), a 16-bit register is used, and results of cyclically left-shifting and cyclically right-shifting are consistent, both of which are to interchange eight most significant bits and eight least significant bits of the register.

The following provides another specific example. Various specific features in the example may be all incorporated into the foregoing embodiment independently.

In the example, PC coding is performed when CRC coding is performed. In addition, in the following example, Z is 8, and the state space module is a CRC register group.

The example includes the following blocks:

preparing an index table by using CRC values corresponding to all possible permutations and combinations of eight to-be-encoded bits, and storing the index table offline;

initializing a state of the CRC register group to all 0s (0x0000) (it should be noted that when a state space value in the CRC register group is initialized to all 1s, a finally obtained CRC bit should be negated);

left-shifting the CRC register group by eight bits, and saving a result to the CRC register group;

performing an XOR operation between original eight most significant bits of the CRC register group before left-shifting by eight bits and the eight to-be-encoded bits to obtain an index pointing to the table;

performing an XOR operation between a table value to which the index points and the CRC register group to obtain a new state space value;

obtaining a PC bit value from the new state space value, performing the foregoing (4) for next eight to-be-encoded bits, and repeating the cycle until a last to-be-encoded bit in the sequence of to-be-encoded bits is processed; and after the last to-be-encoded bit in the sequence of to-be-encoded bits is processed, using an obtained state space value as a CRC bit, and performing CRC coding.

Figure 12:
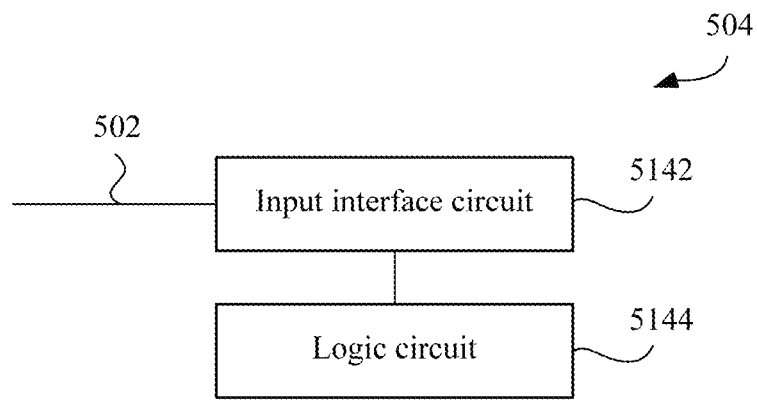
FIG. 12 is a schematic structural diagram of an encoding processing apparatus according to this application.

As shown in FIG. 12, an embodiment of the present disclosure further provides an encoding processing apparatus 504. The processing apparatus 504 may be implemented by hardware or may be implemented by software. When the processing apparatus is implemented by hardware, referring to FIG. 12, the processing apparatus 504 includes:

an input interface circuit 5142, configured to receive a sequence of to-be-encoded bits; and a logic circuit 5144, configured to: initialize a state space value in a state space module, and obtain, from the sequence of to-be-encoded bits, a group of Z to-be-encoded bits including Z information bits; and obtain a new state space value based on the Z to-be-encoded bits that are obtained, and assign a value to an auxiliary bit, where the obtaining anew state space value based on the Z to-be-encoded bits that are obtained, and assigning a value to an auxiliary bit includes: obtaining a corresponding index value from an index module based on values in the Z to-be-encoded bits that are obtained and the state space value in the state space module, performing an operation based on the index value and the state space value to obtain a new state space value, and updating the state space value in the state space module to the new state space value; encoding the Z to-be-encoded bits that are obtained, and if an auxiliary bit is located between information bits of the Z information bits in the sequence of to-be-encoded bits and an auxiliary bit is located between the Z information bits and a next information bit in the sequence of to-be-encoded bits, obtaining a value from the new state space value and assigning the value to the auxiliary bit; and obtaining, from the sequence of to-be-encoded bits, a next group of Z to-be-encoded bits including Z information bits that follow the group of Z to-be-encoded bits, where the next group of Z to-be-encoded bits is adjacent to the group of Z to-be-encoded bits, obtaining a new state space value based on the next group of Z to-be-encoded bits, assigning a value to an auxiliary bit, and repeating the cycle until the next group of Z to-be-encoded bits is a last to-be-encoded bit in the sequence of to-be-encoded bits.

In a specific implementation, the processing apparatus may be a chip or an integrated circuit.

The processing apparatus shown in FIG. 12 according to this embodiment of the present disclosure may be configured to perform each embodiment of the encoding method shown in FIG. 8 or FIG. 10 or FIG. 11. Implementation principles and technical effects thereof are similar. Specifically, if the processing apparatus shown in FIG. 12 according to this embodiment of the present disclosure is configured to perform each embodiment of the encoding method shown in FIG. 8, various specific implementations of block S101 in the encoding method shown in FIG. 8 may also be correspondingly used as various specific implementations of a function of the input interface circuit 5142 of the processing apparatus shown in FIG. 12. Various specific implementations of blocks S102, S104, S105, S106, S3060, and S307 in the encoding method shown in FIG. 8 may also be correspondingly used as various specific implementations of a function of the logic circuit 5144 of the processing apparatus shown in FIG. 12.

If the processing apparatus shown in FIG. 12 according to this embodiment of the present disclosure is configured to perform each embodiment of the encoding method shown in FIG. 10, the input interface circuit 5142 is configured to receive a sequence of to-be-encoded bits; and the logic circuit 5144 is configured to: initialize a state space value in a state space module, and obtain, from the sequence of to-be-encoded bits, a group of Z to-be-encoded bits including information bits and auxiliary bits; and obtain a new state space value based on the Z to-be-encoded bits that are obtained, and assign a value to an auxiliary bit, where the obtaining a new state space value based on the Z to-be-encoded bits that are obtained, and assigning a value to an auxiliary bit includes: setting a position of an auxiliary bit in the Z to-be-encoded bits to a fixed value; then obtaining a corresponding index value from an index module based on values in the Z to-be-encoded bits and the state space value in the state space module, performing an operation based on the index value and the state space value to obtain a new state space value, and updating the state space value in the state space module to the new state space value; encoding the Z to-be-encoded bits after the position of the auxiliary bit in the Z to-be-encoded bits is set to the fixed value, and obtaining a value from the new state space value and assigning the value to the auxiliary bit in the Z to-be-encoded bits; and then obtaining, from the sequence of to-be-encoded bits, a next group of Z to-be-encoded bits including information bits and auxiliary bits that follow the group of Z to-be-encoded bits, where the next group of Z to-be-encoded bits is adjacent to the group of Z to-be-encoded bits, obtaining a new state space value based on the next group of Z to-be-encoded bits, assigning a value to an auxiliary bit, and repeating the cycle until the next group of Z to-be-encoded bits is a last to-be-encoded bit in the sequence of to-be-encoded bits.

Specifically, various specific implementations of block S201 in the encoding method shown in FIG. 10 may also be correspondingly used as various specific implementations of a function of the input interface circuit 5142 of the processing apparatus shown in FIG. 12. Various specific implementations of blocks S202, S203, S204, S205, S206, S3060, and S307 in the encoding method shown in FIG. 10 may also be correspondingly used as various specific implementations of a function of the logic circuit of the processing apparatus shown in FIG. 12.

If the processing apparatus shown in FIG. 12 according to this embodiment of the present disclosure is configured to perform each embodiment of the encoding method shown in FIG. 11, the input interface circuit 5142 is configured to receive a sequence of to-be-encoded bits; and the logic circuit 5144 is configured to: initialize a state space value in a state space module, and obtain, from the sequence of to-be-encoded bits, a group of Z to-be-encoded bits that are adjacent; and obtain a new state space value based on the Z to-be-encoded bits that are obtained, and assign a value to an auxiliary bit, where the obtaining a new state space value based on the Z to-be-encoded bits that are obtained, and assigning a value to an auxiliary bit includes: if the Z to-be-encoded bits include an auxiliary bit, setting a position of the auxiliary bit to a fixed value, or if the Z to-be-encoded bits include a frozen bit, setting a position of the frozen bit to a fixed value, where the Z to-be-encoded bits include at least one of an information bit, the frozen bit, and the auxiliary bit; then obtaining a corresponding index value from an index module based on values in the Z to-be-encoded bits and the state space value in the state space module, performing an operation based on the index value and the state space value to obtain a new state space value, and updating the state space value in the state space module to the new state space value; encoding the Z to-be-encoded bits after the positions of the auxiliary bit and the frozen bit in the Z to-be-encoded bits are set to the fixed values, and if the Z to-be-encoded bits include the auxiliary bit, obtaining a value from the new state space value and assigning the value to the auxiliary bit; and then obtaining, from the sequence of to-be-encoded bits, a next group of Z to-be-encoded bits that are adjacent and follow the group of Z to-be-encoded bits, where the next group of Z to-be-encoded bits is adjacent to the group of Z to-be-encoded bits, obtaining a new state space value based on the next group of Z to-be-encoded bits, assigning a value to an auxiliary bit, and repeating the cycle until the next group of Z to-be-encoded bits is a last to-be-encoded bit in the sequence of to-be-encoded bits.

Specifically, various specific implementations of block S301 in the encoding method shown in FIG. 11 may also be correspondingly used as various specific implementations of a function of the input interface circuit 5142 of the processing apparatus shown in FIG. 12. Various specific implementations of blocks S302, S303, S304, S305, S306, S3060, and S307 in the encoding method shown in FIG. 11 may also be correspondingly used as various specific implementations of a function of the logic circuit of the processing apparatus shown in FIG. 12.

Figure 13:
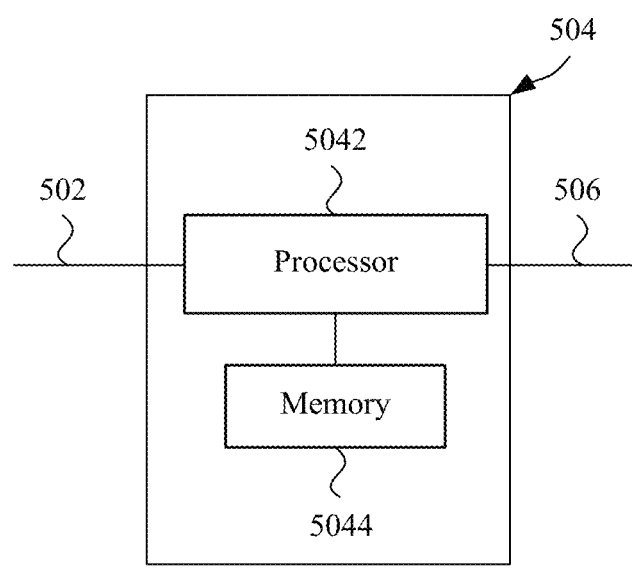
FIG. 13 is a schematic structural diagram of another encoding processing apparatus according to this application.

When the processing apparatus 504 is implemented by software, referring to FIG. 13, the processing apparatus 504 includes:

a memory 5044, configured to store a program; and a processor 5042, configured to execute the program stored in the memory, where when the program is executed, the processing apparatus is configured to implement each embodiment of the encoding method shown in FIG. 8, FIG. 10, or FIG. 11.

Figure 14:
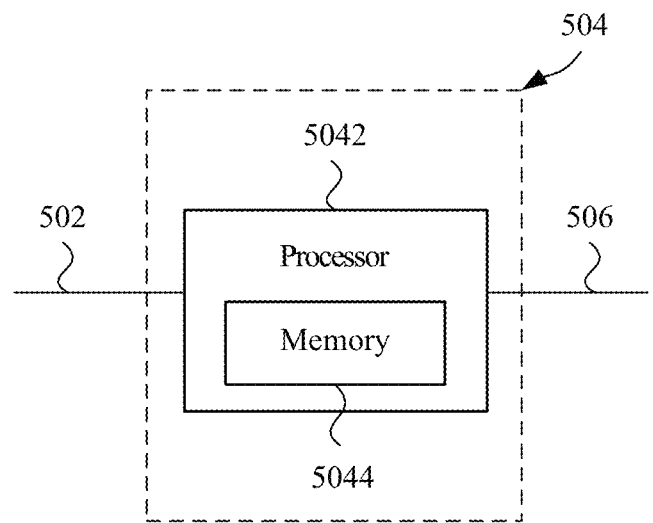
FIG. 14 is a schematic structural diagram of still another encoding processing apparatus according to this application.

The memory 5044 may be a physically independent unit, or may be integrated with the processor 5042. For details, refer to FIG. 14.

Figure 15:
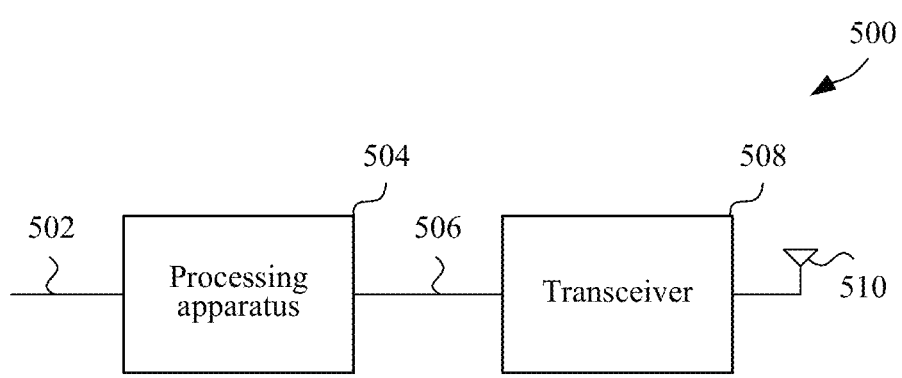
FIG. 15 is a schematic structural diagram of a communications device according to this application.

Referring to FIG. 15, this application further provides an embodiment of a communications device 500, configured to implement an encoding function. The communications device 500 includes the processing apparatus 504 in each of the foregoing embodiments, and a transceiver, where the transceiver is configured to transmit a rate-matched sequence.

Figure 16:
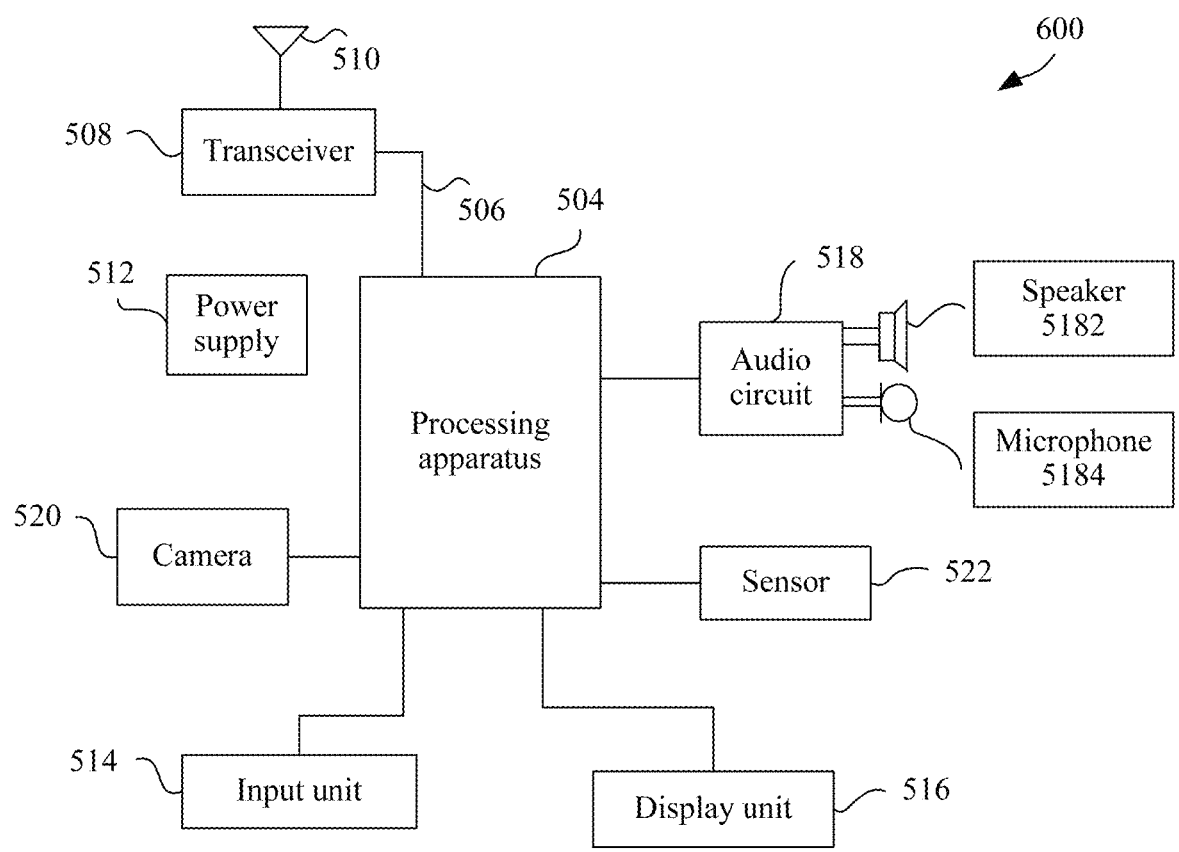
FIG. 16 is a schematic structural diagram of a terminal according to this application.

The communications device may be a terminal or a network device. When the communications device is a terminal, referring to FIG. 16, the terminal 600 may further include a power supply 512, configured to supply power for each component or circuit in the terminal. The terminal may further include an antenna 510, configured to transmit, by using a radio signal, uplink data output by the transceiver, or output a received radio signal to the transceiver.

In addition, to make functions of the terminal more comprehensive, the terminal may further include one or more of an input unit 514, a display unit 516, an audio circuit 518, a camera 520, and a sensor 522, where the audio circuit 518 may include a speaker 5182, a microphone 5184, or the like.

With reference to the foregoing descriptions, a person skilled in the art may be aware that, the methods of the embodiments in this specification may be implemented by hardware (for example, a logic circuit), or software, or a combination of hardware and software. Whether the methods are performed by hardware or software depends on particular applications and design constraints of the technical solutions. A person skilled in the art may use different methods to implement the described functions for each particular application, but it should not be considered that the implementation goes beyond the scope of this application.

When the functions are implemented in a form of software and sold or used as an independent product, the functions may be stored in a computer-readable storage medium. In this case, the technical solutions of this application essentially, or the part contributing to the prior art, or some of the technical solutions may be implemented in a form of a computer software product. The computer software product is stored in a storage medium, and includes several instructions for instructing a computer device (which may be a personal computer, a server, a network device, or the like) to perform all or some of the blocks of the methods described in the embodiments of this application. The foregoing storage medium includes any medium that can store program code, such as a USB flash drive, a removable hard disk, a read-only memory (ROM, Read-Only Memory), a random access memory (RAM, Random Access Memory), a magnetic disk, or an optical disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

The invention claimed is:

1. An encoding method, comprising: receiving a sequence of to-be-encoded bits;
   initializing a state space value in a state space module, and obtaining, from the sequence of to-be-encoded bits, a group of Z to-be-encoded bits comprising Z information bits;
   obtaining a corresponding index value from an index module based on values in the Z to-be-encoded bits and the state space value in the state space module;
   performing an operation based on the index value and the state space value to obtain a new state space value;
   updating the state space value in the state space module to the new state space value;
   encoding the Z to-be-encoded bits to obtain a sequence of encoded bits;
   in response to determining that an auxiliary bit is located between information bits of the Z information bits in the sequence of to-be-encoded bits and an auxiliary bit is located between the Z information bits and a next information bit in the sequence of to-be-encoded bits:
      obtaining a value based on the new state space value and assigning the value to the auxiliary bit; and
      obtaining, from the sequence of to-be-encoded bits, a next group of Z to-be-encoded bits comprising Z information bits that follow the group of Z to-be-encoded bits, wherein the next group of Z to-be-encoded bits is adjacent to the group of Z to-be-encoded bits, using the next group of Z to-be-encoded bits as an input for obtaining the corresponding index value performing the operation, and updating the state space value, and repeating the cycle until the next group of Z to-be-encoded bits is a last to-be-encoded bit in the sequence of to-be-encoded bits; and transmitting the sequence of encoded bits to a device.

2. The encoding method of claim 1, wherein performing the operation based on the index value and the state space value comprises: performing a bitwise logical operation between the index value and the state space value.

3. The encoding method of claim 1, wherein obtaining the corresponding index value from an index module based on values in the Z to-be-encoded bits and the state space value in the state space module comprises:

cyclically shifting the state space value in a fixed direction by Z bits, then performing an operation between Z least significant bits of the state space value and the values in the Z to-be-encoded bits to obtain an index ID, and obtaining, by using the index ID, the index value stored in the index module; and correspondingly, the performing the operation based on the index value and the state space value comprises:

performing a bitwise logical operation between the index value and the state space value.

4. The encoding method of claim 1, wherein after obtaining the next group of Z to-be-encoded bits, the encoding method further comprises:

using the last to-be-encoded bit in the sequence of to-be-encoded bits as an input for obtaining the corresponding index value, and after encoding the Z to-be-encoded bits, using an obtained state space value in the state space module as a cyclic redundancy check (CRC) check bit, and performing CRC coding, wherein while obtaining the value based on the new state space value and assigning the value to the auxiliary bit, the auxiliary bit is a parity check, PC, check bit.

5. An encoding method, wherein the encoding method comprises:

receiving a sequence of to-be-encoded bits;

initializing a state space value in a state space module, and obtaining, from the sequence of to-be-encoded bits, a group of Z to-be-encoded bits comprising information bits and auxiliary bits;

setting a position of an auxiliary bit in the Z to-be-encoded bits to a fixed value;

obtaining a corresponding index value from an index module based on values in the Z to-be-encoded bits and the state space value in the state space module;

performing an operation based on the index value and the state space value to obtain a new state space value;

updating the state space value in the state space module to the new state space value;

encoding the Z to-be-encoded bits to obtain a sequence of encoded bits;

obtaining a value based on the new state space value and assigning the value to the auxiliary bit in the Z to-be-encoded bits;

obtaining, from the sequence of to-be-encoded bits, a next group of Z to-be-encoded bits comprising information bits and auxiliary bits that follow the group of Z to-be-encoded bits, wherein the next group of Z to-be-encoded bits is adjacent to the group of Z to-be-encoded bits, using the next group of Z to-be-encoded bits as an input for setting the position of the auxiliary bit, obtaining the corresponding index, and encoding the Z to-be-encoded bits, and repeating the cycle until the next group of Z to-be-encoded bits is a last to-be-encoded bit in the sequence of to-be-encoded bits; and transmitting the sequence of encoded bits to a device.

6. The encoding method of claim 5, wherein performing the operation based on the index value and the state space value comprises: performing a bitwise logical operation between the index value and the state space value.

7. The encoding method of claim 5, wherein obtaining the corresponding index value from an index module based on values in the Z to-be-encoded bits and the state space value in the state space module comprises:

cyclically shifting the state space value in a fixed direction by Z bits, then performing an operation between Z least significant bits of the state space value and the values in the Z to-be-encoded bits to obtain an index ID;

obtaining, by using the index ID, the index value stored in the index module; and correspondingly, performing the operation based on the index value and the state space value comprises:

performing a bitwise logical operation between the index value and the state space value.

8. The encoding method of claim 5, wherein obtaining the next group of Z to-be-encoded bits, the method further comprises:

using the last to-be-encoded bit in the sequence of to-be-encoded bits as an input for setting the position of the auxiliary bit, and after encoding the Z to-be-encoded bits, using an obtained state space value in the state space module as a CRC check bit, and performing CRC coding, wherein during the obtaining the value based on the new state space value and assigning the value to the auxiliary bit, the auxiliary bit is a PC check bit.

9. An encoding processing apparatus, comprising:

an input interface circuit, configured to receive a sequence of to-be-encoded bits; and a logic circuit coupled to the input interface circuit, the logic circuit configured to:

initialize a state space value in a state space module, and obtain, from the sequence of to-be-encoded bits, a group of Z to-be-encoded bits comprising Z information bits;

obtain a new state space value based on the Z to-be-encoded bits that are obtained, and assign a value to an auxiliary bit, wherein the obtaining the new state space value based on the Z to-be-encoded bits that are obtained, and assigning the value to the auxiliary bit comprises: obtaining a corresponding index value from an index module based on values in the Z to-be-encoded bits that are obtained and the state space value in the state space module, performing an operation based on the index value and the state space value to obtain the new state space value, and updating the state space value in the state space module to the new state space value;

encoding the Z to-be-encoded bits that are obtained, to obtain a sequence of encoded bits, and if an auxiliary bit is located between information bits of the Z information bits in the sequence of to-be-encoded bits and an auxiliary bit is located between the Z information bits and a next information bit in the sequence of to-be-encoded bits, obtaining a value based on the new state space value and assigning the value to the auxiliary bit;

obtaining, from the sequence of to-be-encoded bits, a next group of Z to-be-encoded bits comprising Z information bits that follow the group of Z to-beencoded bits, wherein the next group of Z to-be-encoded bits is adjacent to the group of Z to-be-encoded bits, obtaining a new state space value based on the next group of Z to-be-encoded bits, assigning a value to an auxiliary bit, and repeating the cycle until the next group of Z to-be-encoded bits is a last to-be-encoded bit in the sequence of to-be-encoded bits; and transmitting the sequence of encoded bits to a device.

10. The encoding processing apparatus of claim 9, wherein the performing the operation based on the index value and the state space value comprises: performing a bitwise logical operation between the index value and the state space value.

11. The encoding processing apparatus of claim 9, wherein obtaining the corresponding index value from an index module based on values in the Z to-be-encoded bits that are obtained and the state space value in the state space module comprises:

cyclically shifting the state space value in a fixed direction by Z bits;

performing an operation between Z least significant bits of the state space value and the values in the Z to-be-encoded bits that are obtained to obtain an index ID;

obtaining, by using the index ID, the index value stored in the index module; and correspondingly, performing the operation based on the index value and the state space value comprises:

performing a bitwise logical operation between the index value and the state space value.

12. The encoding processing apparatus of claim 9, wherein the logic circuit is further configured to:

obtain a new state space value based on the last to-be-encoded bit in the sequence of to-be-encoded bits, and after assigning a value to an auxiliary bit;

use the obtained state space value in the state space module as a CRC check bit; and perform CRC coding, wherein when the value is obtained based on the new state space value and assigned to the auxiliary bit, the auxiliary bit is a PC check bit.

13. An encoding processing apparatus, comprising:

an input interface circuit, configured to receive a sequence of to-be-encoded bits; and a logic circuit coupled to the input interface circuit, the logic circuit configured to:

initialize a state space value in a state space module, and obtain, from the sequence of to-be-encoded bits, a group of Z to-be-encoded bits comprising information bits and auxiliary bits;

obtain a new state space value based on the Z to-be-encoded bits that are obtained, and assign a value to an auxiliary bit, wherein obtaining the new state space value based on the Z to-be-encoded bits that are obtained, and assigning the value to the auxiliary bit comprises: setting a position of an auxiliary bit in the Z to-be-encoded bits to a fixed value;

obtain a corresponding index value from an index module based on values in the Z to-be-encoded bits and the state space value in the state space module, performing an operation based on the index value and the state space value to obtain a new state space value, and updating the state space value in the state space module to the new state space value;

encode the Z to-be-encoded bits after the position of the auxiliary bit in the Z to-be-encoded bits is set to the fixed value to obtain a sequence of encoded bits, and obtaining a value based on the new state space value and assigning the value to the auxiliary bit in the Z to-be-encoded bits;

obtain, from the sequence of to-be-encoded bits, a next group of Z to-be-encoded bits comprising information bits and auxiliary bits that follow the group of Z to-be-encoded bits, wherein the next group of Z to-be-encoded bits is adjacent to the group of Z to-be-encoded bits, obtaining a new state space value based on the next group of Z to-be-encoded bits, assigning a value to an auxiliary bit, and repeating the cycle until the next group of Z to-be-encoded bits is a last to-be-encoded bit in the sequence of to-be-encoded bits; and transmit the sequence of encoded bits to a device.

14. The encoding processing apparatus of claim 13, wherein performing the operation based on the index value and the state space value comprises: performing a bitwise logical operation between the index value and the state space value.

15. The encoding processing apparatus of claim 13, wherein obtaining the corresponding index value from an index module based on values in the Z to-be-encoded bits and the state space value in the state space module comprises:

cyclically shifting the state space value in a fixed direction by Z bits;

performing an operation between Z least significant bits of the state space value and the values in the Z to-be-encoded bits to obtain an index ID;

obtaining, by using the index ID, the index value stored in the index module; and correspondingly, the performing an operation based on the index value and the state space value comprises:

performing a bitwise logical operation between the index value and the state space value.

16. The encoding processing apparatus of claim 13, wherein the logic circuit is further configured to:

obtain a new state space value based on the last to-be-encoded bit in the sequence of to-be-encoded bits, and after assigning a value to an auxiliary bit;

use the obtained state space value in the state space module as a CRC check bit; and perform CRC coding, wherein when the value is obtained based on the new state space value and assigned to the auxiliary bit, the auxiliary bit is a PC check bit.

* * * * *